(12) United States Patent
Choi et al.

(10) Patent No.: US 11,094,709 B2
(45) Date of Patent: Aug. 17, 2021

(54) METHOD OF MANUFACTURING SEMICONDUCTOR DEVICE

(71) Applicant: Samsung Electronics Co., Ltd., Suwon-si (KR)

(72) Inventors: Eun Yeoung Choi, Hwaseong-si (KR); Hyung Joon Kim, Yongin-si (KR); Jung Geun Jee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/441,657

(22) Filed: Jun. 14, 2019

(65) Prior Publication Data

US 2020/0135759 A1    Apr. 30, 2020

(30) Foreign Application Priority Data

Oct. 29, 2018   (KR) .................. 10-2018-0129800

(51) Int. Cl.
| | | |
|---|---|---|
| *H01L 29/792* | (2006.01) | |
| *H01L 27/11582* | (2017.01) | |
| *H01L 21/768* | (2006.01) | |
| *H01L 27/11568* | (2017.01) | |

(52) U.S. Cl.
CPC .............. *H01L 27/11582* (2013.01); *H01L 21/76877* (2013.01); *H01L 27/11568* (2013.01); *H01L 29/7926* (2013.01)

(58) Field of Classification Search
None
See application file for complete search history.

(56) References Cited

U.S. PATENT DOCUMENTS

| | | | |
|---|---|---|---|
| 8,273,628 B2 | 9/2012 | Yahashi | |
| 8,580,639 B2 | 11/2013 | Alsmeier et al. | |
| 8,673,721 B2 | 3/2014 | Toshiro et al. | |
| 9,673,216 B1 | 6/2017 | Baraskar et al. | |
| 9,875,929 B1 | 1/2018 | Shukla et al. | |
| 2017/0033044 A1* | 2/2017 | Choi | H01L 21/76877 |
| 2017/0243945 A1 | 8/2017 | Sekine et al. | |
| 2017/0263615 A1 | 9/2017 | Sakaike et al. | |
| 2017/0271527 A1 | 9/2017 | Higuchi et al. | |
| 2018/0033799 A1* | 2/2018 | Kanamori | H01L 27/11582 |
| 2018/0122907 A1 | 5/2018 | Choi et al. | |

* cited by examiner

*Primary Examiner* — Hung K Vu
(74) *Attorney, Agent, or Firm* — Muir Patent Law, PLLC

(57) ABSTRACT

A hole is formed to pass through preliminary first mold layers and preliminary second mold layers to form first mold layers and mold layers respectively that are alternately stacked in a vertical direction, perpendicular to a lower structure, on the lower structure. The first mold layers are partially etched along a side surface of the hole to form recess regions and recessed first mold layers. Third mold layers are formed in the recess regions to form interlayer insulation layers so that each of the interlayer insulation layers includes a corresponding third mold layer and a corresponding recessed first mold layer that are positioned at the same level in the vertical direction. A first dielectric layer is formed in the hole to cover the third mold layers and the second mold layers stacked on each other. Information storage patterns are formed on the first dielectric layer.

10 Claims, 26 Drawing Sheets

METHOD OF MANUFACTURING SEMICONDUCTOR DEVICE

CROSS-REFERENCE TO RELATED APPLICATION

This application claims benefit of priority to Korean Patent Application No. 10-2018-0129800 filed on Oct. 29, 2018 in the Korean Intellectual Property Office, the disclosure of which is incorporated herein by reference in its entirety.

BACKGROUND

1. Field

The present inventive concept relates to a method of manufacturing a semiconductor device.

2. Description of Related Art

For the price competitiveness of products, there is growing demand for improvements in the degree of integration of semiconductor devices. A higher degree of integration of semiconductor devices may be obtained by stacking gates in a direction perpendicular to an upper surface of a semiconductor substrate. As the number of stacked gates increases, interference between information storage regions corresponding to the stacked gates may increase.

SUMMARY

According to an exemplary embodiment of the present inventive concept, a method of manufacturing a semiconductor device is provided as follows. A hole is formed to pass through preliminary first mold layers and preliminary second mold layers to form first mold layers and mold layers respectively that are alternately stacked in a vertical direction, perpendicular to a lower structure, on the lower structure. The first mold layers are partially etched along a side surface of the hole to form recess regions and recessed first mold layers. Third mold layers are formed in the recess regions to form interlayer insulation layers so that each of the interlayer insulation layers includes a corresponding third mold layer and a corresponding recessed first mold layer that are positioned at the same level in the vertical direction. A first dielectric layer is formed in the hole to cover the third mold layers and the second mold layers stacked on each other. Information storage patterns are formed on the first dielectric layer.

According to an exemplary embodiment of the present inventive concept, a method of manufacturing a semiconductor device is provided as follows. A stacked structure including preliminary first mold layers and preliminary second mold layers alternately and repeatedly stacked on a lower structure in a vertical direction, perpendicular to the lower structure is formed. A hole is formed to pass through the stacked structure to form first mold layers and second mold layers. The hole exposes side surfaces of the first mold layers and side surfaces of the second mold layers. The first mold layers exposed by the holes are partially etched to form recess regions and recessed first mold layers. Third mold layers are formed in the recess regions to form interlayer insulation layers. Each of the interlayer insulation layers includes a corresponding recessed first mold layer and a corresponding third mold layer that are positioned at the same level in the vertical direction. Each of the third mold layers is interposed between two adjacent second mold layers and is protruded into the hole beyond side surfaces of the two adjacent second mold layers. A first dielectric layer is formed in the hole along side surfaces of the third mold layers and the side surfaces of the second mold layers. Information storage patterns are formed on the first dielectric layer. The information storage patterns are opposite to the second mold layers and spaced apart from each other in the vertical direction. A second dielectric layer is formed to cover the first dielectric layer and the information storage patterns in the hole so that the information storage patterns are interposed between the first dielectric layer and the second dielectric layer. A channel semiconductor layer is formed to cover the second dielectric layer in the hole. Each of the information storage patterns has an overlapped portion with the third mold layers in the vertical direction and a non-overlapped portion with the third mold layers in the vertical direction.

According to an exemplary embodiment of the present inventive concept, a method of manufacturing a semiconductor device is provided as follows. A stacked structure is formed by stacking alternately interlayer insulation layers and mold layers on a substrate. A hole having a corrugated inner side surface passes through the stacked structure. Each of the interlayer insulation layers has a rounded corner as part of the corrugated inner side surface of the hole. A vertical memory structure including information storage patterns is formed on the corrugated inner side surface of the hole so that the information storage patterns are spaced apart from each other in a vertical direction perpendicular to the substrate. Each of the interlayer insulation layers includes an inner mold layer having a first density and an outer mold layer having a second density greater than the first density.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
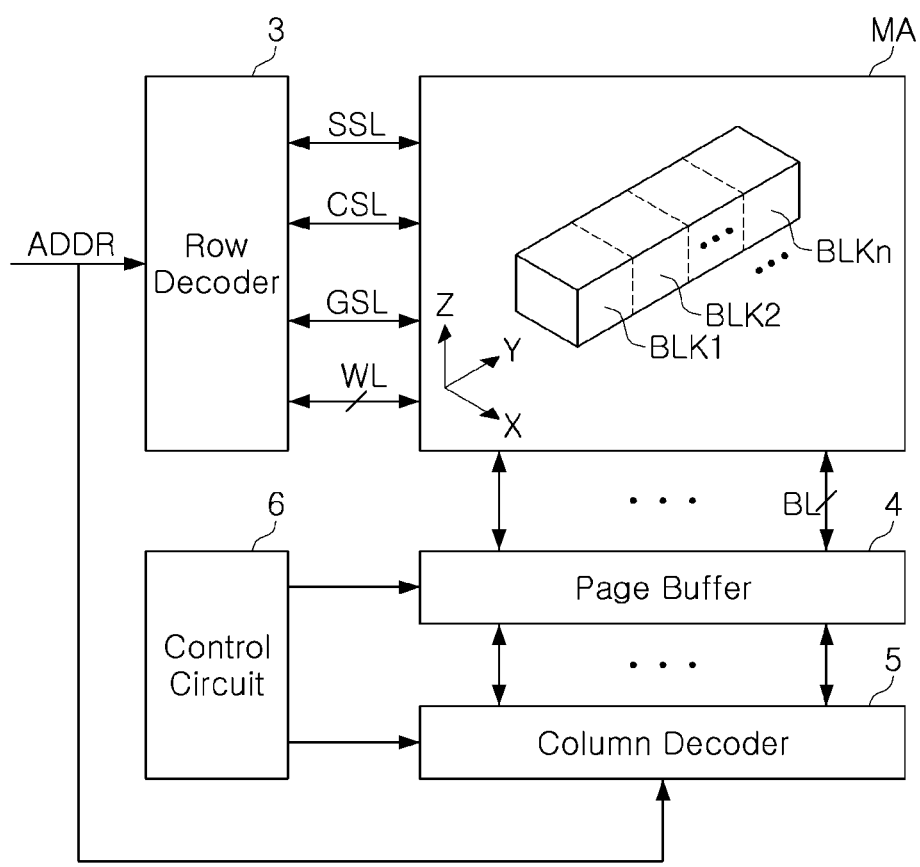
FIG. 1 is a schematic block diagram of a semiconductor device according to example embodiments.

FIG. 1 is a schematic block diagram of a semiconductor device according to example embodiments.

Referring to FIG. 1, a semiconductor device 1 may include a memory array MA, a row address decoder 3, a page buffer 4, a column address decoder 5, and a control circuit 6.

The memory array MA may include a plurality of memory blocks BLK1, BLK2, BLKn. Each of the memory blocks BLK1, BLK2, BLKn may include a plurality of memory cells arranged in a plurality of rows and columns. The plurality of memory cells may be electrically connected to the row address decoder 3 via word lines WL, at least one common source line CSL, at least one string select line SSL, and at least one ground select line GSL. In addition, the memory cells may be electrically connected to the page buffer 4 and the column address decoder 5 through bit lines BL.

In an embodiment, among the memory cells, the memory cells arranged in the same row may be connected to the same word line WL, and the memory cells arranged in the same column may be connected to the same bit line BL.

The row address decoder 3 may be commonly connected to the memory blocks BLK1, BLK2, . . . BLKn, and may provide a driving signal to the word lines WL of the memory blocks BLK1, BLK2, . . . BLKn selected according to a block selection signal. For example, the row address decoder 3 may receive address information ADDR from an external source and decode the received address information ADDR, to supply a voltage to at least a portion of the word lines WL, the common source line CSL, the string select line SSL, and the ground select line GSL, electrically connected to the memory blocks BLK1, BLK2, . . . BLKn.

The page buffer 4 may be electrically connected to the memory array MA through the bit lines BL. The page buffer 4 may be connected to a bit line BL selected according to an address decoded by the column address decoder 5. The page buffer 4 may temporarily store data to be stored in the memory cells, or sense data stored in the memory cells, according to an operation mode. For example, the page buffer 4 may operate as a writing driver circuit in a program operation mode, and as a sense amplifier circuit in a read operation mode. The page buffer 4 may receive power (e.g., voltage or current) from the control logic, and may provide the same to a selected bit line BL.

The column address decoder 5 may receive address information ADDR and provide a data transmission path between the page buffer 4 and an external device (e.g., a memory controller) according to the received address information ADDR. The column address decoder 5 may decode the received address information ADDR to select any one of the bit lines BL. The column address decoder 5 may be commonly connected to the memory blocks BLK1, BLK2, BLKn, and may provide data information to the bit lines BL of the selected memory block BLK1, BLK2, . . . BLKn according to a block selection signal. In an exemplary embodiment, the address information ADDR may be received by the row address decoder 3 and the column address decoder 5 in a time-multiplexed manner.

The control circuit 6 may control the overall operation of the semiconductor device 1. The control circuit 6 may receive a control signal and an external voltage, and may generate various signals and voltages for the overall operation according to the control signal. The control circuit 6 may include a voltage generator that generates voltages necessary for internal operations (e.g., program voltage, read voltage, erase voltage, etc.) using an external voltage. The control circuit 6 may control read, write, and/or erase operations in response to the control signal.

Figure 2:
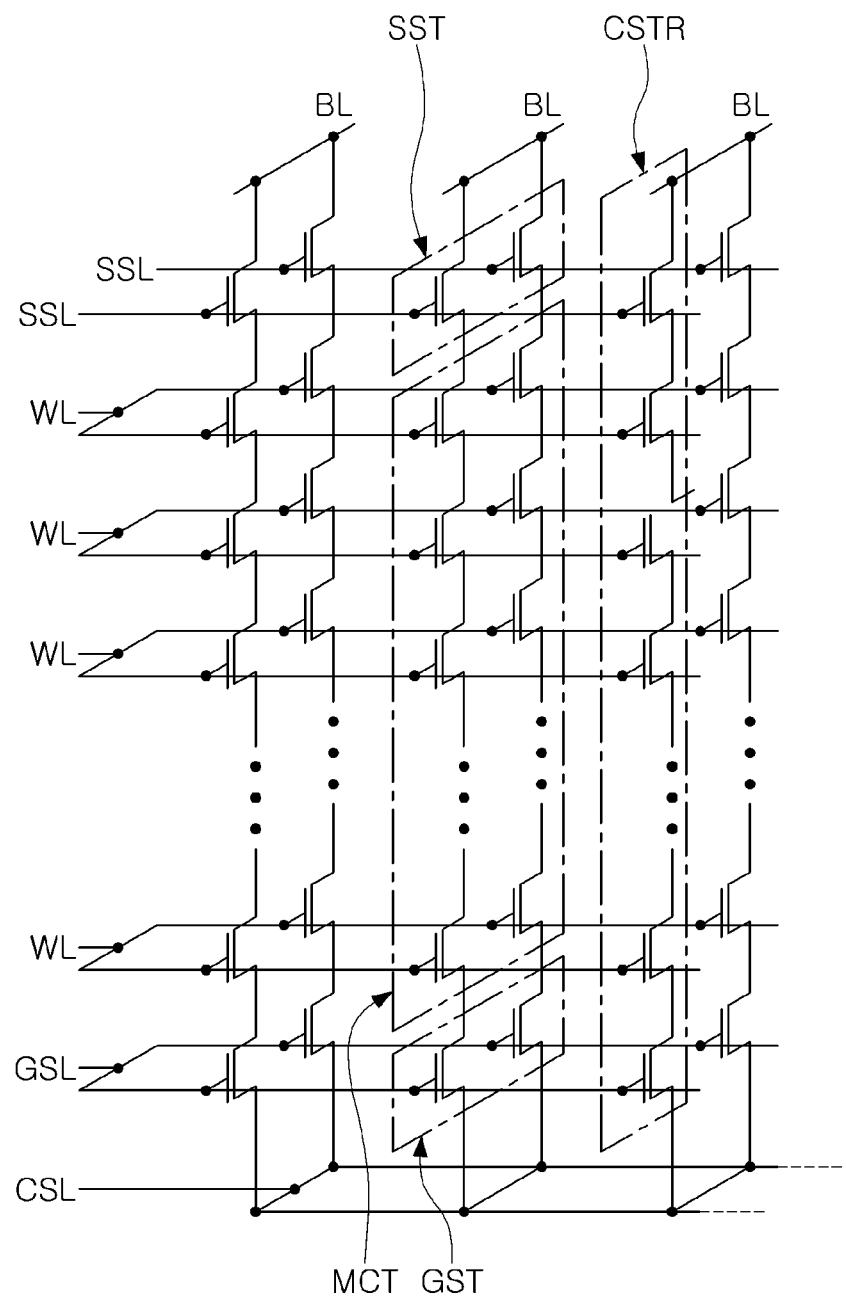
FIG. 2 is a circuit diagram conceptually illustrating a memory array of a semiconductor device according to example embodiments.

FIG. 2 is a circuit diagram conceptually illustrating a memory array of a semiconductor device according to example embodiments.

Referring to FIGS. 1 and 2, a memory array MA may include a common source line CSL, bit lines BL, and a plurality of cell strings CSTR arranged between the common source line CSL and the bit lines BL.

The plurality of cell strings CSTR may be connected to each of the bit lines BL in parallel. The plurality of cell strings CSTR may be commonly connected to the common source line CSL. Each of the plurality of cell strings CSTR may include a lower select transistor GST, memory cells MCT and an upper select transistor SST, which may be connected in series.

In each of the cell strings CSTR, the memory cells MCT may be connected between the lower select transistor GST and the upper select transistor SST in series. Each of the memory cells MCT may include information storage region, which may store information.

The upper select transistor SST may be electrically connected to a corresponding bit line of the bit lines BL, and the lower select transistor GST may be electrically connected to the common source line CSL.

The upper select transistor SST may be controlled by a string select line SSL. The memory cells MCT may be controlled by a plurality of word lines WL. In an example embodiment, the upper select transistor SST may be provided in plural.

The lower select transistor GST may be controlled by a ground select line GSL. The common source line CSL may be commonly connected to a source of the lower select transistor GST.

In an example embodiment, the upper select transistor SST may be a string select transistor, and the lower select transistor GST may be a ground select transistor.

Next, the semiconductor device according to the example embodiments will be described in detail with reference to FIGS. 3 to 5A.

Figure 3:
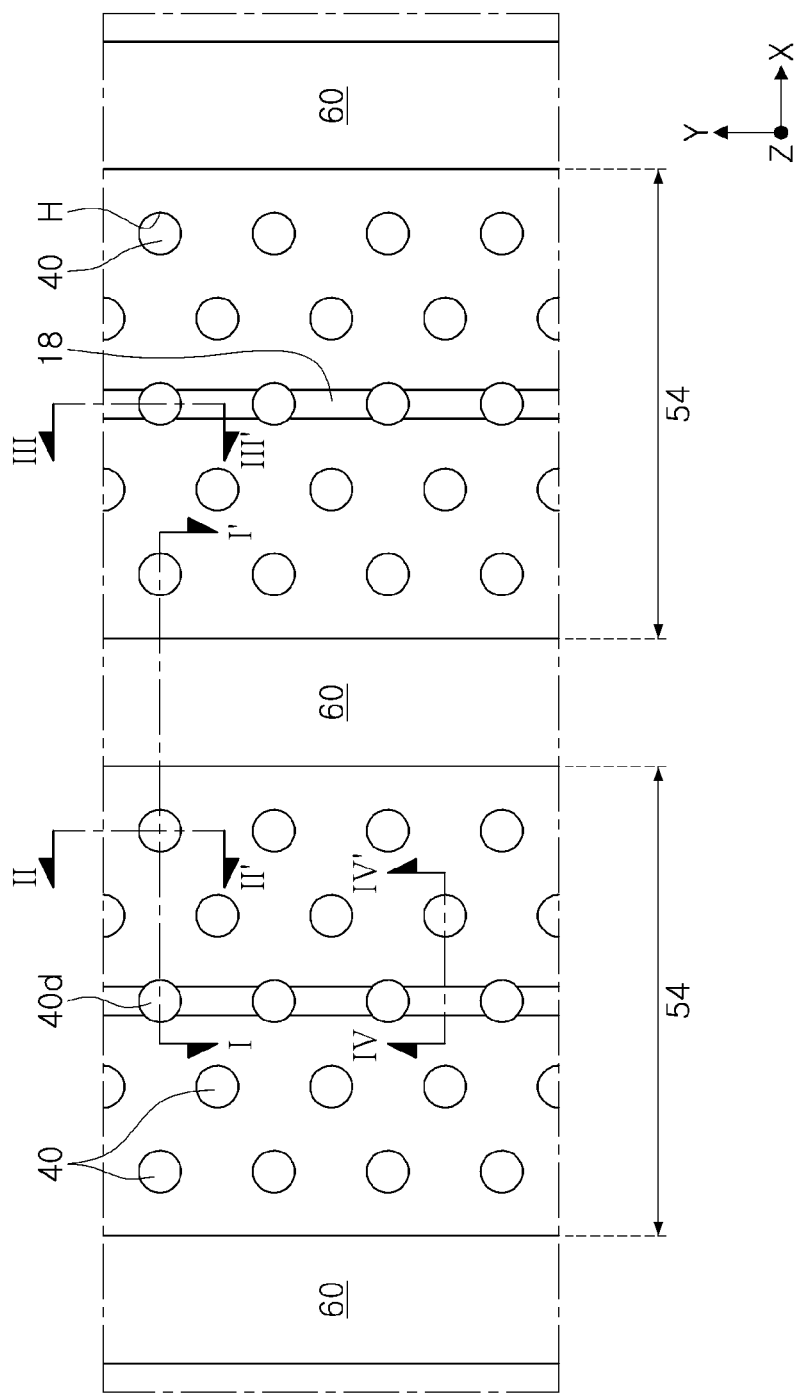
FIG. 3 is a plan view of a semiconductor device according to example embodiments.
Figure 4A:
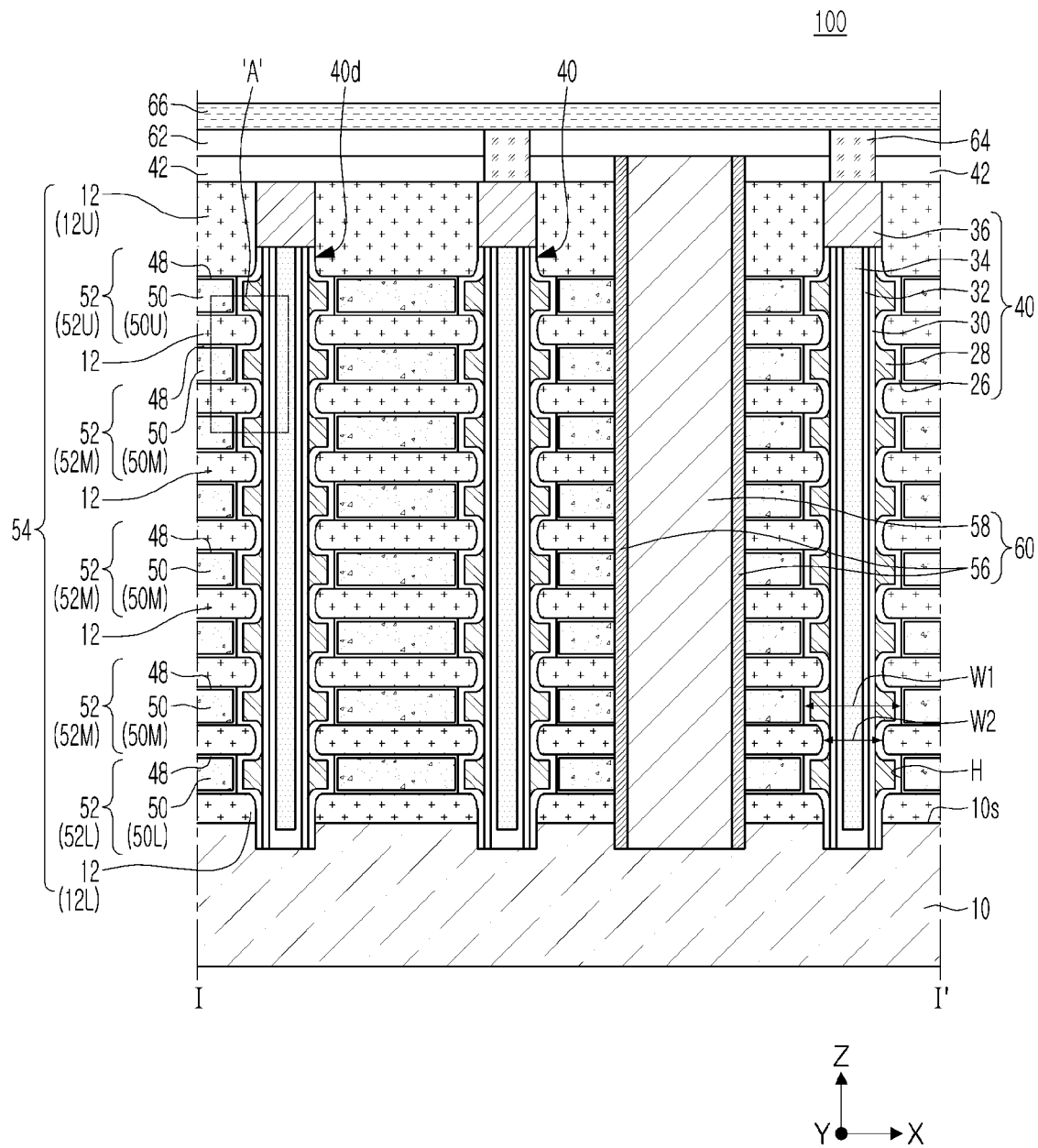
FIGS. 4A and 4B are cross-sectional views illustrating a semiconductor device according to example embodiments.
Figure 4B:
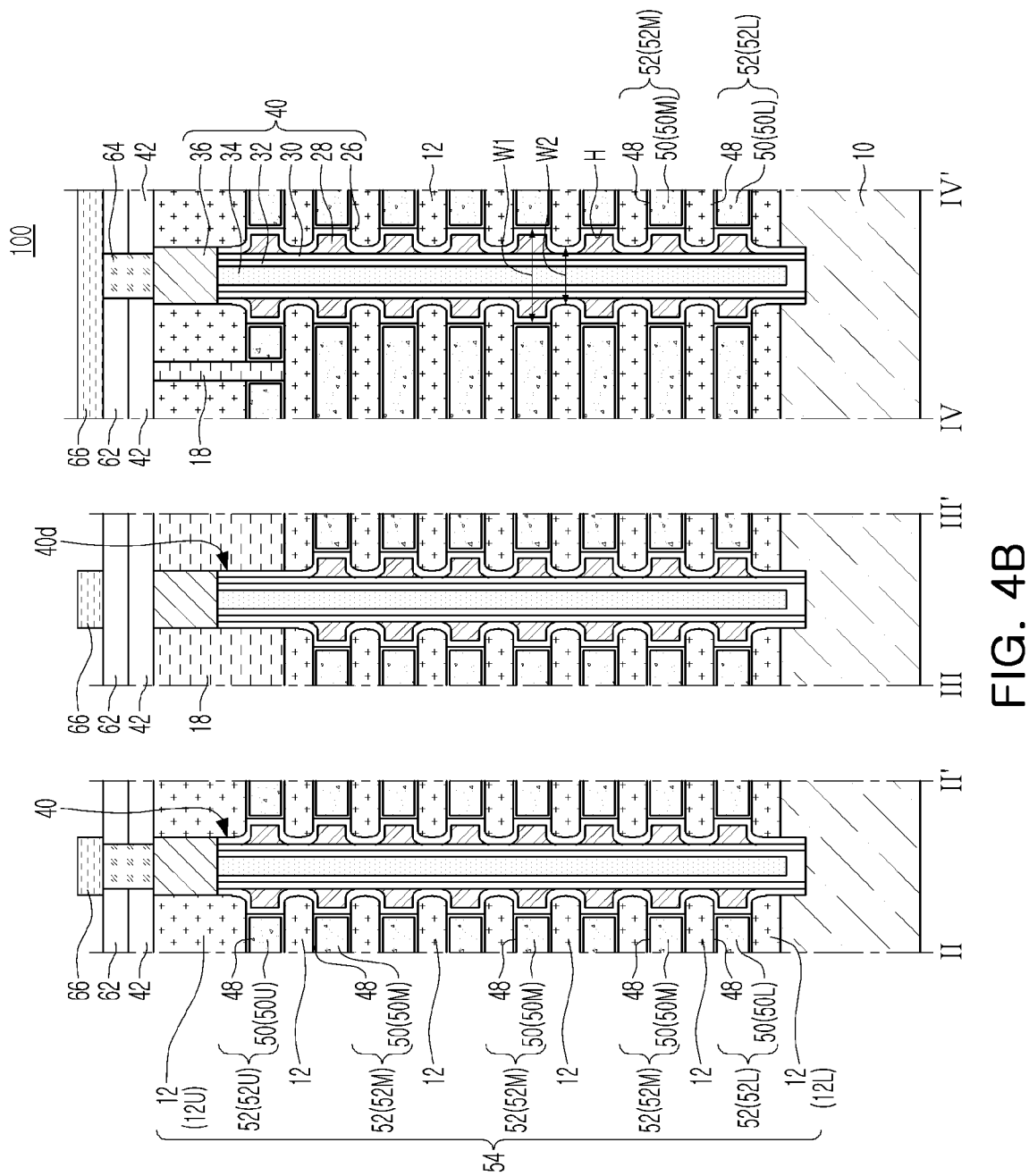
Figure 5A:
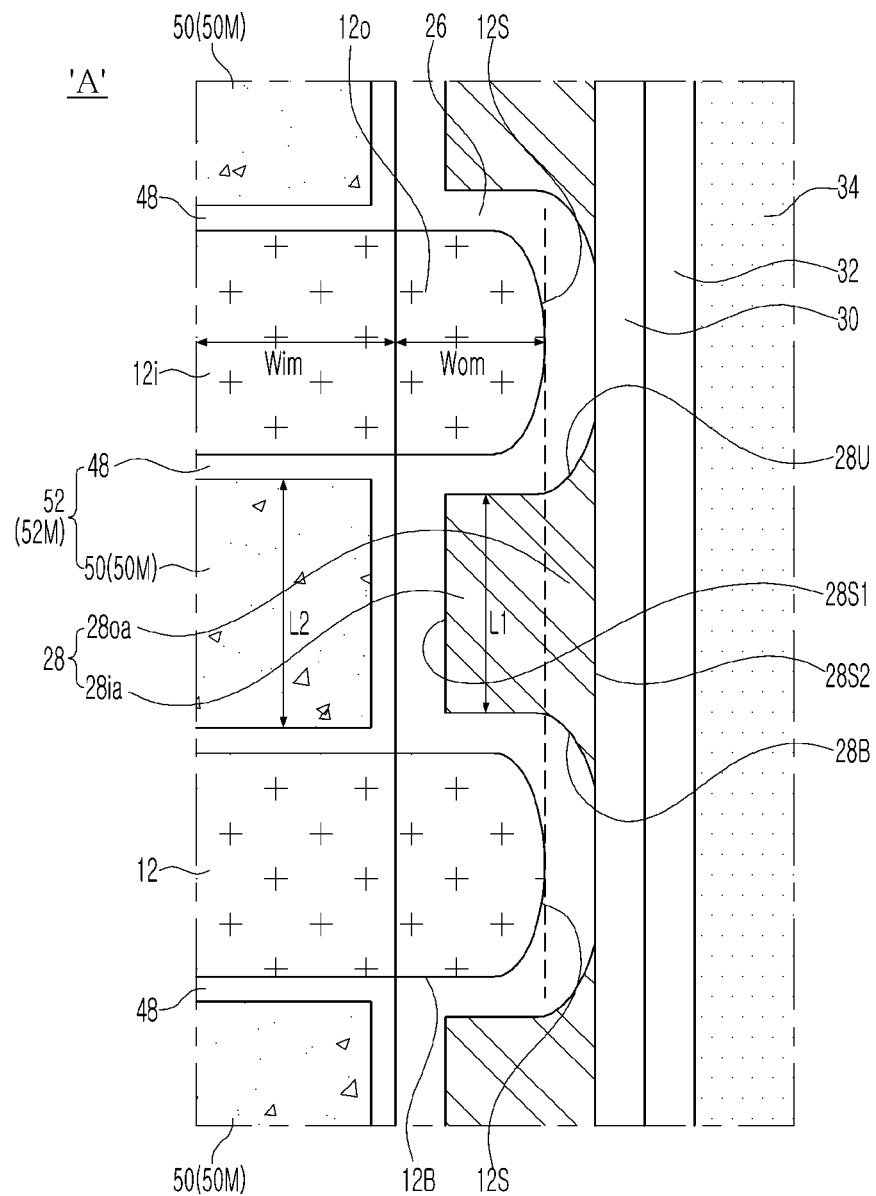
FIGS. 5A and 5B are partially enlarged cross-sectional views of a semiconductor device according to an example embodiment.

FIG. 3 is a plan view of a semiconductor device according to example embodiments. In FIG. 3, for the sake of understanding, only main components of the semiconductor device may be illustrated. FIGS. 4A and 4B are cross-sectional views illustrating a semiconductor device according to example embodiments. FIG. 4A illustrates a cross-section along line I-I' in FIG. 3, and FIG. 4B illustrates cross-sections along lines and IV-IV' in FIG. 3. FIG. 5A is a partially enlarged cross-sectional view of a semiconductor device according to an example embodiment. FIG. 5A is an enlarged cross-sectional view of portion "A" in FIG. 4A.

Referring to FIGS. 3 to 5A, a semiconductor device 100 may include a lower structure 10, and a stacked structure 54 disposed on the lower structure 10.

The lower structure 10 may have an upper surface extending in a x direction and in an y direction. The lower structure 10 may comprise a semiconductor material, such as a Group IV semiconductor, a Group III-V compound semiconductor, or a Group II-VI oxide semiconductor. For example, the Group IV semiconductor may comprise silicon, germanium or silicon-germanium. The lower structure 10 may be provided as a bulk wafer or an epitaxial layer.

The stacked structure 54 may include interlayer insulation layers 12 and gate patterns 52. The gate patterns 52 may be stacked on the lower structure 10 and may be spaced apart from each other in a z direction perpendicular to an upper surface 10s of the lower structure 10. Each of the gate patterns 52 may be disposed between two adjacent interlayer insulation layers of the interlayer insulation layers 12. For example, the interlayer insulation layers 12 and the gate patterns 52 may be alternately and repeatedly stacked on each other.

According to example embodiments, side surfaces of each of the gate patterns 52 exposed by a hole H may have a flat shape. Therefore, gap-fill characteristics of the gate patterns 52 may be improved as compared with the conventional gate patterns having a curved side surface.

Each of the interlayer insulation layers 12 may include an inner mold layer 12$i$ and an outer mold layer 12$o$. The inner mold layer 12$i$ may be alternately stacked with the gate patterns 52 on the lower structure 10 in the z direction, and the outer mold layer 12$o$ may be formed on side surfaces of the inner mold layer 12$i$ in the hole H. The inner mold layer 12$i$ and the outer mold layer 12$o$ may be formed of an insulating material such as silicon oxide or silicon nitride. The inner mold layer 12$i$ and the outer mold layer 12$o$ may be formed of the same material or different materials. When the inner mold layer 12$i$ and the outer mold layer 12$o$ are formed of different materials, a density of the outer mold layer 12$o$ may be greater than a density of the inner mold layer 12$i$.

According to example embodiments, each of the interlayer insulation layers 12 may include a boundary portion, which corresponds to the outer mold layer 12$o$, protruding from two adjacent gate patterns of the gate patterns 52. The boundary portion may include a side surface 12S and a lower surface 12B, and the side surface 12S may have a rounded shape. For example, at the corner where the lower surface 12B and side surface 12S meet, each of the interlayer insulation layers 12 may have a rounded corner. Therefore, the electric field concentration phenomenon that may occur at an angled boundary portion of a conventional interlayer insulation layer may be avoided, and the lateral charge loss of information storage patterns 28 may be reduced. FIG. 5A exemplarily illustrates the boundary portion of the interlayer insulation layers 12, but the present embodiment is not limited thereto. For example, it should be noted that the boundary portion of the interlayer insulation layers 12 may be modified into various shapes.

Figure 5B:
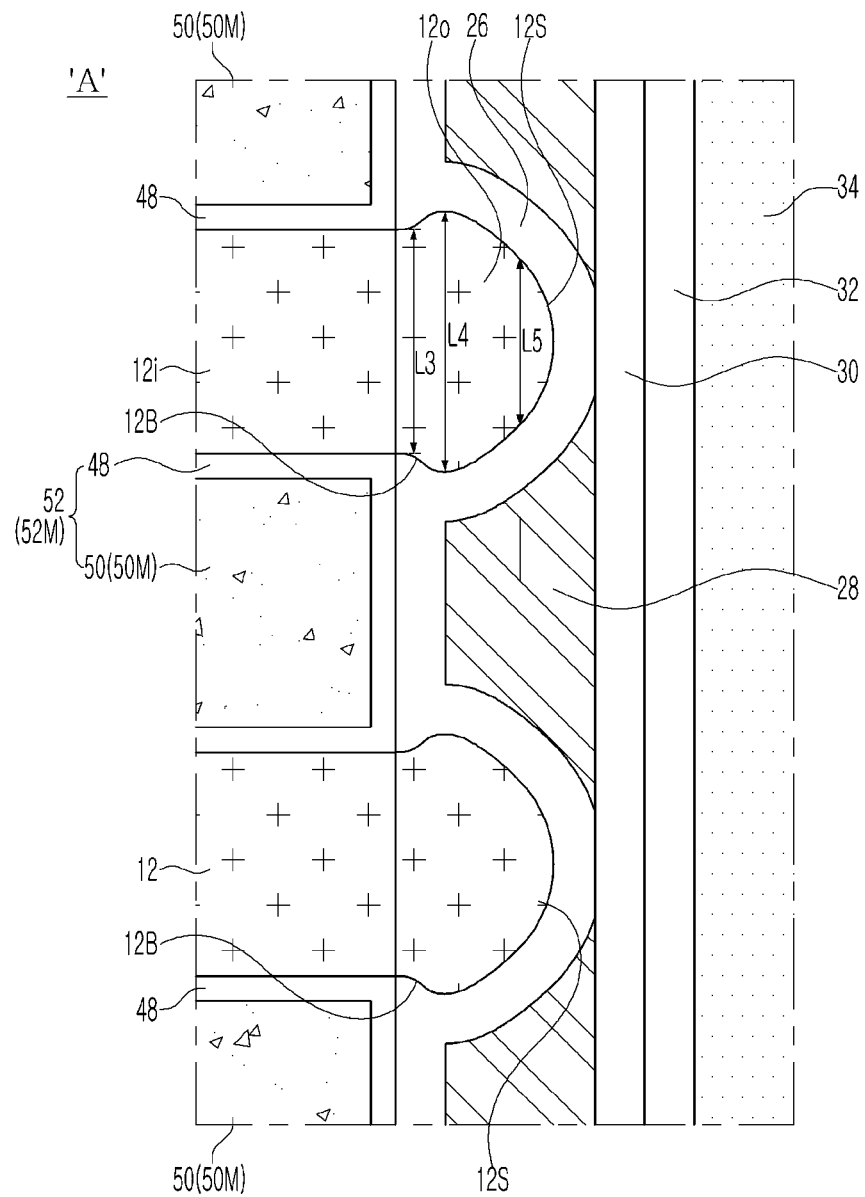

Referring to FIG. 5B, in a modified embodiment, a boundary portion of the interlayer insulation layers 12, for example, a shape of the outer mold layer 12$o$, may have a rounded shape partially protruding up and down in the z direction. For example, a thickness of the outer mold layer 12$o$ may increase from L3 to L4 and then decrease from L4 to L5 in a direction away from the inner mold layer 12$i$.

Referring to FIGS. 3 to 5A again, in an embodiment, the gate patterns 52 may include a lowermost gate pattern 52L, an uppermost gate pattern 52U, and intermediate gate patterns 52M between the lowermost gate pattern 52L and the uppermost gate pattern 52U. An uppermost interlayer insulation layer 12U of the interlayer insulation layers 12 may be disposed on the uppermost gate pattern 52U.

The gate patterns 52 may extend in the y direction parallel to the upper surface 10$s$ of the lower structure 10. An insulation pattern 18 separating the uppermost gate pattern 52U in the x direction may be disposed on the intermediate gate patterns 52M. The insulation pattern 18 may pass through the uppermost interlayer insulation layer 12U and the uppermost gate pattern 52U.

Vertical memory structures 40 extending in the z direction may be disposed on the lower structure 10. The vertical memory structures 40 may be disposed in the holes H that pass through the stacked structure 54. The vertical memory structures 40 may pass through the gate patterns 52 and the interlayer insulation layers 12.

Dummy vertical structures 40$d$ having the same structure as the vertical memory structures 40 and extending in the z direction may be disposed on the lower structure 10. The dummy vertical structures 40$d$ may pass through the gate patterns 52 and the insulation pattern 18.

Each of the vertical memory structures 40 may include a plurality of first portions W1 passing through the plurality of gate patterns 52 and a plurality of second portions W2 passing through the plurality of interlayer insulation layers 12. For example, each of the plurality of first portions W1 may be positioned at the same level in the vertical direction with a corresponding gate pattern of the plurality of gate patterns 52 and each of the plurality of second portions W2 may be positioned at the same level in the vertical direction with a corresponding interlayer insulation layer of the plurality of interlayer insulation layers 12. In each of the vertical memory structures 40, a width of the first portions W1 may be a greater than a width of the second portions W2. An interlayer step difference (i.e., a difference in width between the first portions W1 and the second portions W2) may increase or decrease. For example, when a thickness Wom of the outer mold layer 12$o$ increases, the interlayer step difference may increase. In addition, when an etching amount of the gate pattern 52 in the hole H increases, the interlayer step difference may increase.

A first upper insulation layer 42 may be disposed on the stacked structure 54. Separation structures 60 may pass through the stacked structure 54 and the first upper insulation layer 42, and extend in the y direction.

In an embodiment, each of the separation structures 60 may include a separation pattern 58 and spacers 56 on the side surfaces of the separation pattern 58. The spacers 56 may be formed of an insulating material, for example, silicon oxide. The separation pattern 58 may be formed of a conductive material.

A second upper insulation layer 62 may be disposed on the first upper insulation layer 42. The first and second upper insulation layers 42 and 62 may be formed of silicon oxide.

Conductive lines 66 may be disposed on the second upper insulation layer 62. In an embodiment, the conductive lines 66 may serve as the bit lines BL in FIG. 1 and FIG. 2.

Contact plugs 64 may pass through the first and second upper insulation layers 42 and 62. The contact plugs 64 may electrically connect the conductive lines 66 and the vertical memory structures 40.

Each of the gate patterns 52 may include a first material layer 48 and a second material layer 50. The first material layer 48 may cover upper and lower surfaces of the second material layer 50, and may cover side surfaces of the second material layer 50 facing the vertical memory structures 40 and the dummy vertical structures 40$d$. The first material layer 48 may be interposed between the second material layer 50 and the vertical memory structure 40, and may extend between the second material layer 50 and the interlayer insulation layers 12.

In an embodiment, the first material layer 48 may be formed of a dielectric material, and the second material layer 50 may be formed of a conductive material. For example, the first material layer 48 may be formed of a dielectric material such as aluminum oxide, and the second material layer 50 may be formed of any one, or two or more conductive materials of doped silicon, metal nitride (e.g., TiN, or the like), a metal (e.g., Ti, W, or the like), and a metal-semiconductor compound (e.g., TiSi, WSi or the like).

In other embodiment, the first and second material layers 48 and 50 may be formed of different conductive materials.

For example, the first material layer 48 may be formed of a metal nitride, and the second material layer 50 may be formed of a metal.

When the first material layer 48 is formed of a dielectric material and the second material layer 50 is formed of a conductive material, the second material layers 50 may serve as gate electrodes 50L, 50M, and 50U. Alternatively, when the first and second material layers 48 and 50 are formed of conductive materials, the first and second material layers 48 and 50 may serve as the gate patterns 52L, 52M, and 52U.

Hereinafter, a case that the first material layer 48 is formed of a dielectric material and the second material layer 50 is formed of a conductive material will be mainly explained.

The second material layers 50 of the gate patterns 52 may be gate electrodes 50L, 50M, and 50U. For example, the gate electrodes 50L, 50M, and 50U may include a lowermost gate electrode 50L, intermediate gate electrodes 50M, and an uppermost gate electrode 50U. The lowermost gate pattern 52L may include the lowermost gate electrode 50L, the intermediate gate patterns 52M may include the intermediate gate electrodes 50M, and the uppermost gate pattern 52U may include the uppermost gate electrode 50U.

In an embodiment, the lowermost gate electrode 50L may be the ground select line GSL, the uppermost gate electrode 50U may be the string select line SSL, and the intermediate gate electrodes 50M may be the word lines WL.

Throughout the specification, the intermediate gate electrodes 50M, which may be the word lines WL, may be referred to as 'cell gate electrodes'. The intermediate gate patterns 52M including the intermediate gate electrodes 50M may be referred to as 'cell gate patterns'.

The lowermost gate electrode 50L may be referred to as a 'lower select gate electrode', a 'ground select gate electrode', or a 'ground select line'. The uppermost gate electrode 50U may be referred to as an 'upper select gate electrode', a 'string select gate electrode' or a 'string select line'. The lowermost gate pattern 52L including the lowermost gate electrode 50L may be referred to as a 'lower select gate pattern'. The uppermost gate pattern 52U including the uppermost gate electrode 50U may be referred to as a 'upper select gate pattern'.

Each of the vertical memory structures 40 may include a first dielectric layer 26, information storage patterns 28, a second dielectric layer 30, a channel semiconductor layer 32, a core pattern 34, and a pad pattern 36.

The core pattern 34 may be formed of an insulating material, for example, silicon oxide. The core pattern 34 may pass through the gate patterns 52.

The channel semiconductor layer 32 may extend onto a side surface of the core pattern 34 to surround an outer surface of the core pattern 34. The channel semiconductor layer 32 may be formed of silicon.

The pad pattern 36 may be disposed on the channel semiconductor layer 32 and the core pattern 34. A level of the pad pattern 36 may be higher than that of the uppermost gate pattern 52U. The pad pattern 36 may be formed of silicon having an N-type conductivity.

The second dielectric layer 30 may be disposed between the channel semiconductor layer 32 and the stacked structure 54. The second dielectric layer 30 may be a tunnel dielectric layer. The second dielectric layer 30 may comprise silicon oxide or impurity doped silicon oxide.

The first dielectric layer 26 may be disposed between the second dielectric layer 30 and the stacked structure 54. The first dielectric layer 26 may be a blocking dielectric layer. A thickness of the first material layer 48 may be thinner than that of the first dielectric layer 26. In this case, the first material layer 48 may be formed of a dielectric material having a higher dielectric constant than the first dielectric layer 26. For example, the first dielectric layer 26 may be formed of silicon oxide, and the first material layer 48 may be formed of aluminum oxide having a dielectric constant higher than that of silicon oxide.

In each of the vertical memory structures 40, the information storage patterns 28 disposed in the first portions W1 may be spaced apart from each other in the z direction, and may be disposed between the first dielectric layer 26 and the second dielectric layer 30.

Each of the information storage patterns 28 may include an overlapped portion 28$ia$ overlapping the interlayer insulation layers 12 in the z direction, and a non-overlapped portion 28$oa$ not overlapping the interlayer insulation layers 12 in the z direction. The overlapped portion 28$ia$ may be referred to as an inner region, and the non-overlapped portion 28$oa$ may be referred to as an outer region.

In each of the vertical memory structures 40, the first dielectric layer 26, the second dielectric layer 30, and the channel semiconductor layer 32 may be disposed on the side surfaces of the intermediate gate patterns 52M, i.e., the cell gate patterns exposed by the hole H, and may extend onto the side surfaces of the interlayer insulation layers 12 exposed by the hole H.

The first dielectric layer 26 and the second dielectric layer 30 may be separated from each other by the information storage patterns 28 and may be in contact with each other. For example, the first dielectric layer 26 and the second dielectric layer 30 may be in contact with each other at the level of each of the interlayer insulation layers 12. The first dielectric layer 26 may cover upper surfaces 28U of the information storage patterns 28, lower surfaces 28B of the information storage patterns 28, and first side surfaces 28S1 of the information storage patterns 28 facing the cell gate patterns 52M. The second dielectric layer 30 may cover second side surfaces 28S2 of the information storage patterns 28, opposite to the first side surfaces 28S1 of the information storage patterns 28. The phrase of "A being in contact with B" indicates direct connection between A and B.

The information storage patterns 28 may be disposed between the channel semiconductor layer 32 and the intermediate gate electrodes 50M and may serve to store information. For example, electrons injected into the information storage patterns 28 from the channel semiconductor layer 32 through the second dielectric layer 30 may be trapped and retained, or the trapped electrons in the information storage patterns 28 may be de-trapped, in accordance with operating conditions of a non-volatile memory device such as a flash memory device. Therefore, the information storage patterns 28 may constitute the memory cells MCT described in FIG. 2. The information storage patterns 28 may be formed of a material capable of storing information, such as silicon nitride or polysilicon. A thickness L1 of each of the information storage patterns 28 may be thinner than a thickness L2 of each of the cell gate patterns 52M facing each other. [SAME QUESTION HERE ABOUT AND VS. OR]

Figure 6A:
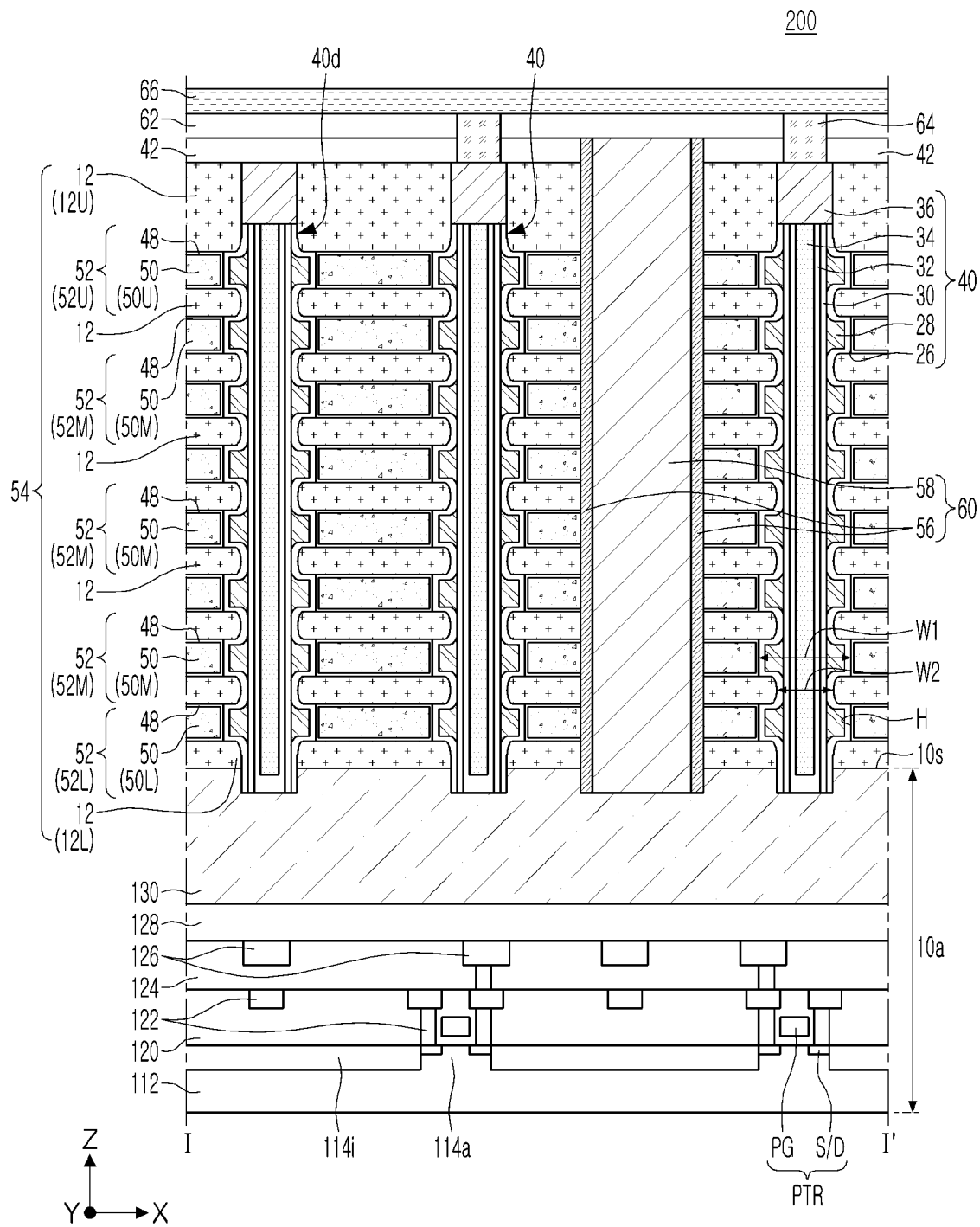
FIG. 6A to 6C are cross-sectional views illustrating a semiconductor device according to example embodiments.
Figure 6B:
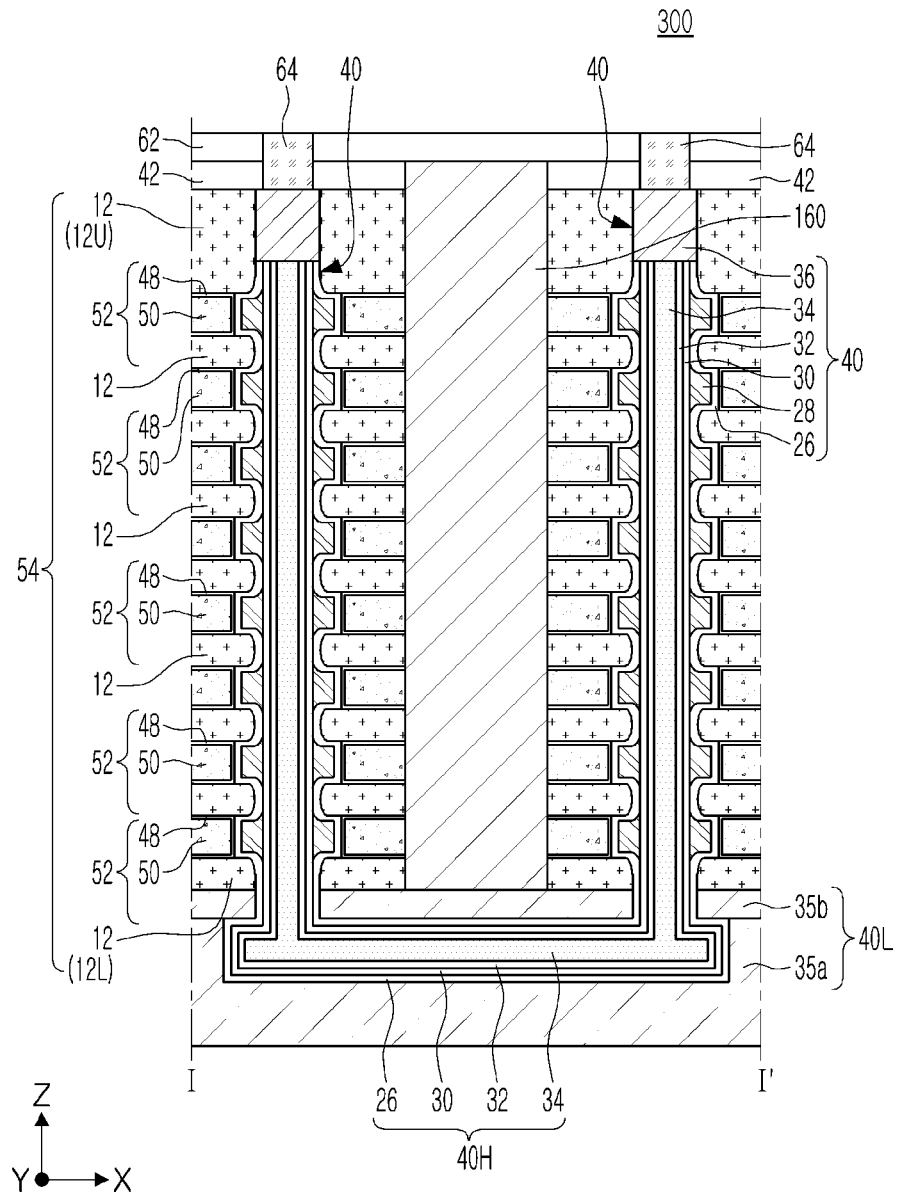
Figure 6C:
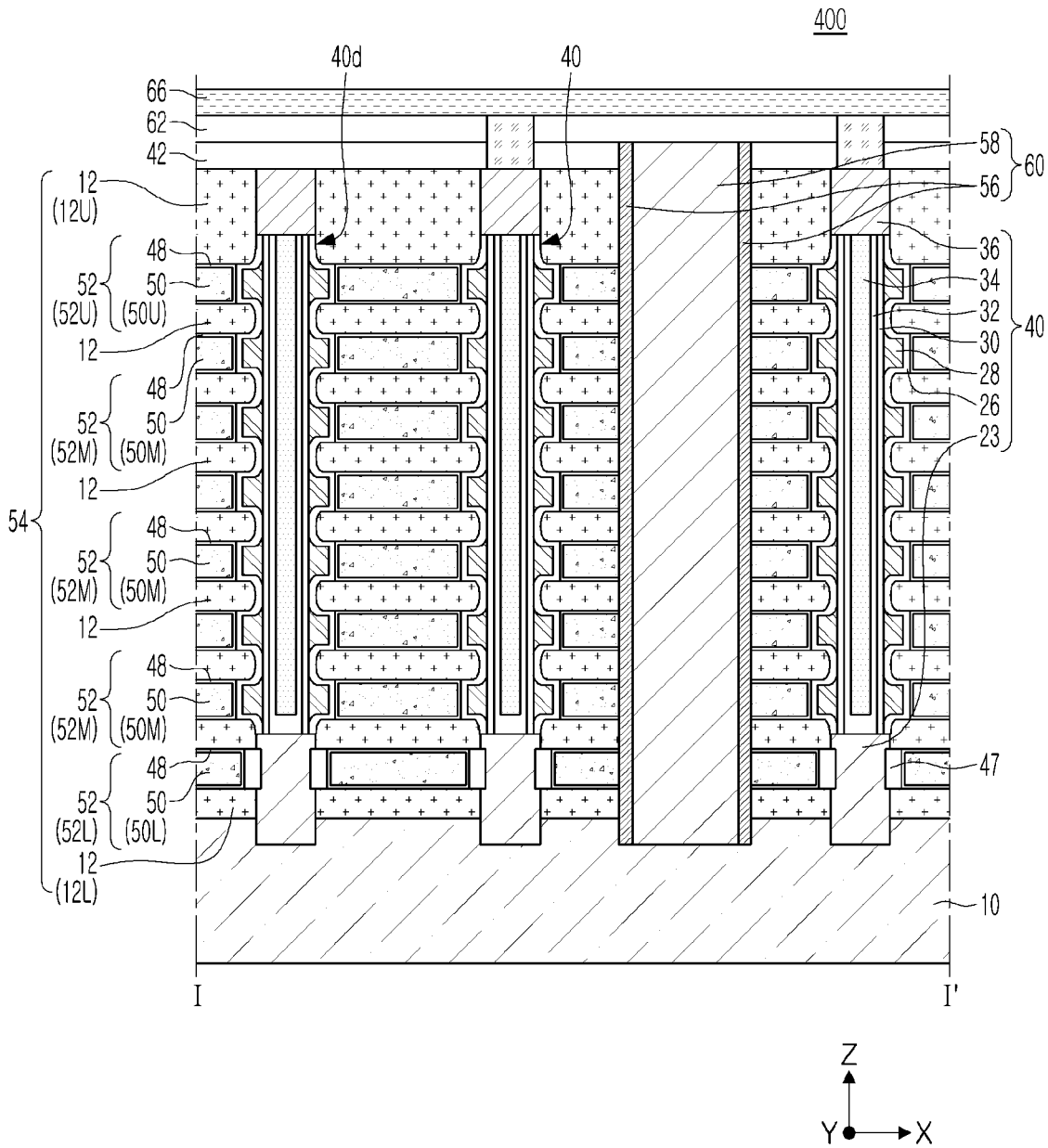

FIG. 6A to 6C are cross-sectional views illustrating a semiconductor device according to example embodiments. Semiconductor devices 200 and 300 illustrated in FIGS. 6A and 6B have substantially the same configuration as the semiconductor device 100 described above with reference to FIG. 4A, except that the lower structures have different structures from each other. Semiconductor devices 400 illustrated in FIG. 6C have substantially the same configuration as the semiconductor devices 100 described above with reference to FIG. 4A, except that the memory elements have different structures from each other. Hereinafter, the same reference numerals may be used for the same components as those in FIG. 4A, and a detailed description thereof will be omitted.

Referring to FIG. 6A, a semiconductor device 200 may include a lower structure 10a, and a stacked structure 54 disposed on the lower structure 10a.

The lower structure 10a may include a first substrate 112, a second substrate 130 on the first substrate 112, and a peripheral circuit region between the first substrate 112 and the second substrate 130.

The first substrate 112 may be a single crystal silicon substrate, and the second substrate 130 may be a polysilicon substrate.

The first substrate 112 may be provided with an element separation region 114i for separating a peripheral active region 114a from other regions.

The peripheral circuit region of the lower structure 10a may include a peripheral transistor PTR including a source/drain S/D and a peripheral gate PG, formed on the peripheral active region 114a, a first lower insulation layer 120 on the first substrate 112, first peripheral wiring lines 122 embedded in the first lower insulation layer 120, a second lower insulation layer 124 on the first lower insulation layer 120, second peripheral wiring lines 126 embedded in the second lower insulation layer 124, and a third lower insulation layer 128 on the second lower insulation layer 124.

Referring to FIG. 6B, a semiconductor device 300 may include a lower structure 40L, and a stacked structure 54 disposed on the lower structure 40L. The stacked structure 54 may include interlayer insulation layers 12 and gate patterns 52, alternately stacked on each other. Each of the gate patterns 52 may include a first material layer 48 and a second material layer 50. A first upper insulation layer 42 and a second upper insulation layer 62, sequentially stacked, may be disposed on the stacked structure 54. Separation structures 160 may pass through the stacked structure 54 and the first upper insulation layer 42. The separation structures 160 may comprise an insulating material, for example silicon oxide.

Vertical memory structures 40 may pass through the stacked structure 54. The vertical memory structures 40 may be connected to each other by a connection portion 40H in the lower structure 40L. For example, each of the vertical memory structures 40 may include the first dielectric layer 26, the information storage patterns 28, the second dielectric layer 30, the channel semiconductor layer 32, the core pattern 34, and the pad pattern 36, as described above with reference to FIGS. 4A and 4B. The first dielectric layer 26, the second dielectric layer 30, the channel semiconductor layer 32, and the core pattern 34 may extend into the lower structure 40L to form the connection portion 40H. Therefore, the vertical memory structures 40 may be connected to each other by the connection portion 40H. In an example embodiment, the connection portion 40H may be disposed in a position lower than a position of the separation structures 60.

In an example embodiment, the lower structure 40L may include a first lower layer 35a, and a second lower layer 35b on the first lower layer 35a. The first and second lower layers 35a and 35b may be formed of silicon, for example, doped silicon.

Referring to FIG. 6C, a vertical memory structure 40 of a semiconductor device 400 may further include a semiconductor pattern 23. The semiconductor pattern 23 may face the lowermost gate pattern 52L of the gate patterns 52, and may be disposed on a lower level than the intermediate gate patterns 52M. The vertical memory structure 40 may include the first dielectric layer 26, the information storage patterns 28, the second dielectric layer 30, the channel semiconductor layer 32, the core pattern 34, and the pad pattern 36, as described above. The channel semiconductor layer 32 may be in contact with the semiconductor pattern 23.

The semiconductor pattern 23 may be formed by epitaxial growth from the lower structure 10. An additional dielectric layer 47, for example a silicon oxide layer, may be disposed between the lowermost gate pattern 52L and the semiconductor pattern 23.

Next, a method of manufacturing a semiconductor device according to an example embodiment will be described in detail with reference to FIG. 3 and FIGS. 7A to 14B.

FIGS. 7A to 14B are views illustrating a method of manufacturing a semiconductor device according to example embodiments.

Figure 7A:
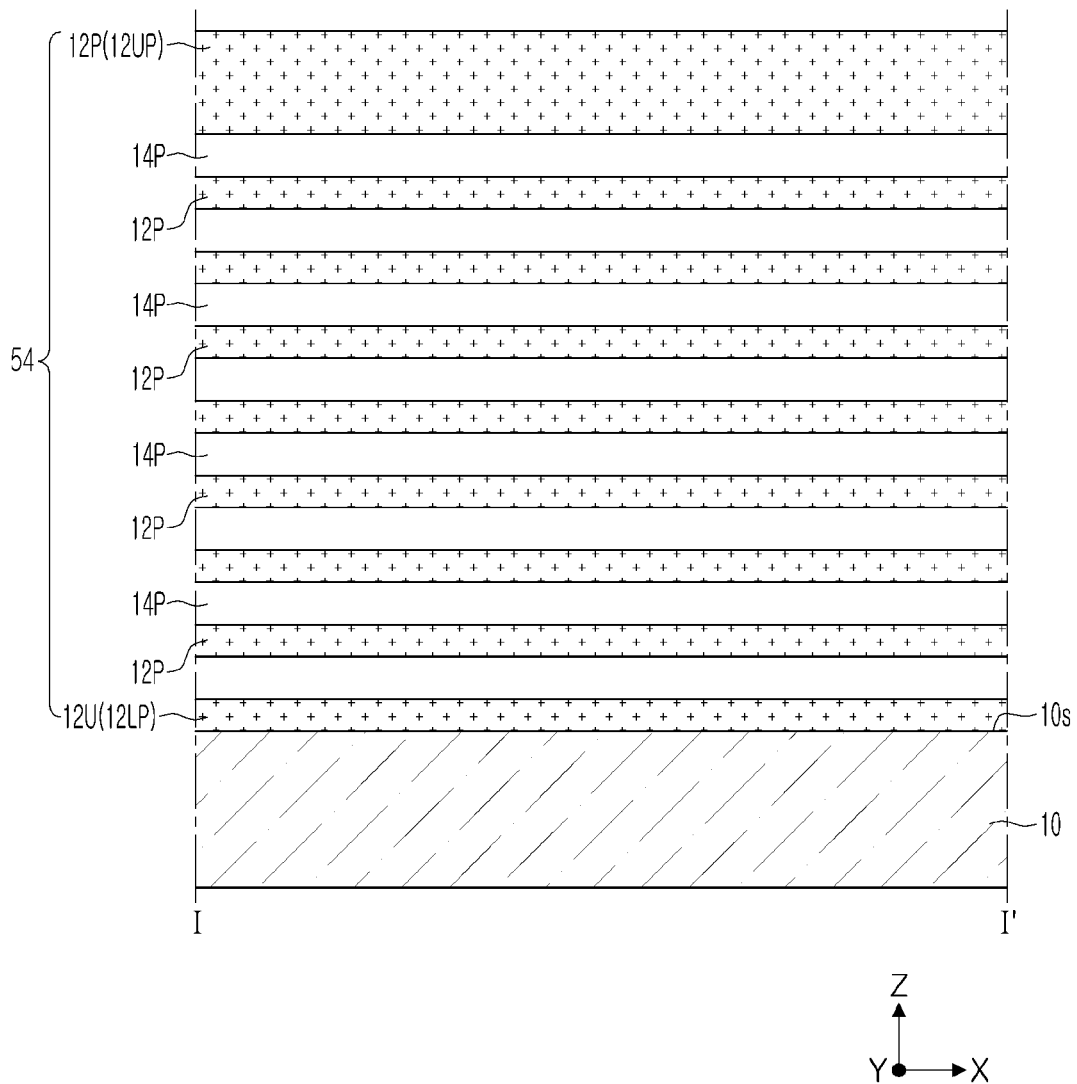
FIGS. 7A to 14B are plan views and cross-sectional views illustrating a method of manufacturing a semiconductor device according to example embodiments.
Figure 7B:
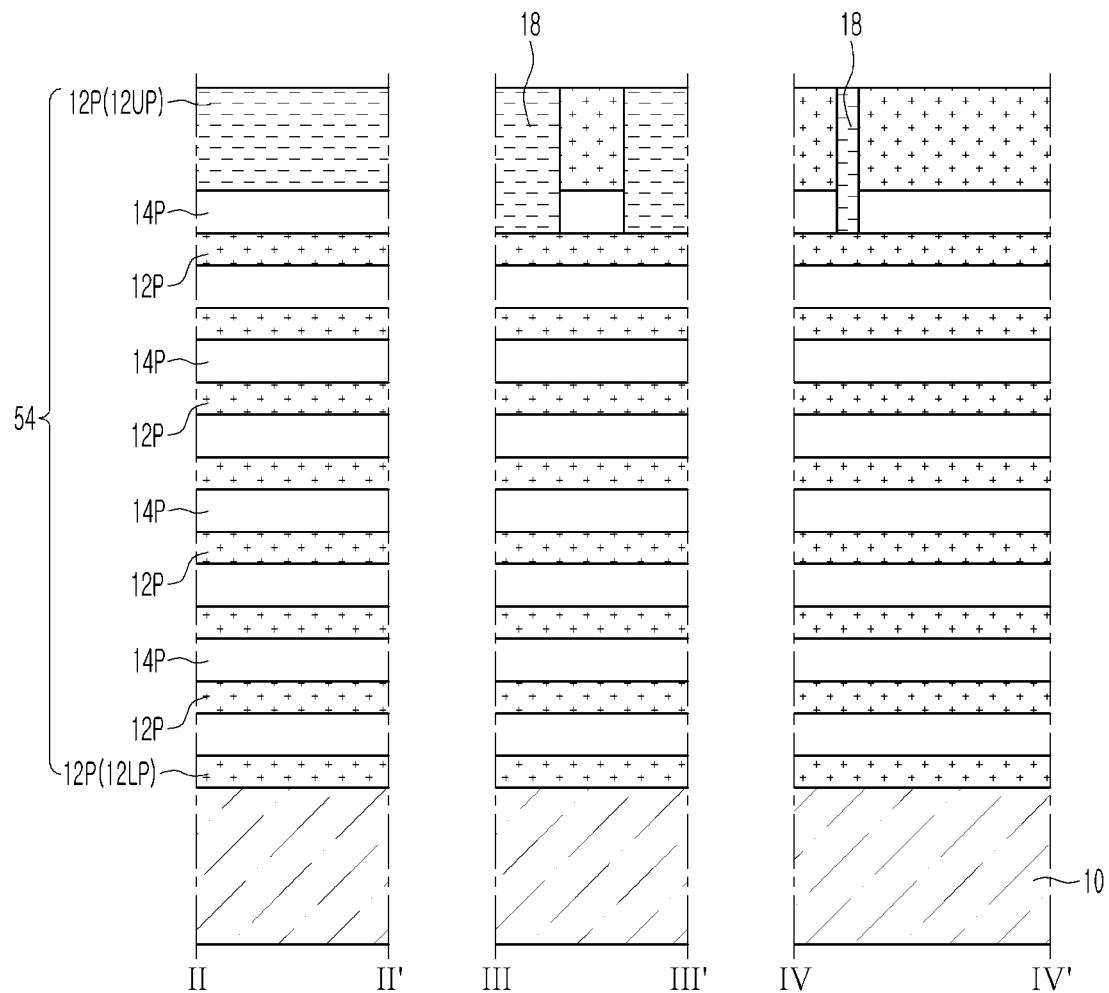

FIG. 7A is a cross-sectional view taken along line I-I' in FIG. 3, and FIG. 7B is a cross-sectional view taken along lines and IV-IV' in FIG. 3. In FIG. 8A to 14B, figures ending with A (e.g., FIGS. 8A, 9A, 10A, 11A, 12A, 13A, and 14A) are cross-sectional views taken along line I-I' in FIG. 3, and figures ending with B (e.g., FIGS. 8B, 9B, 10B, 11B, 12B, 13B, and 14B) are partially enlarged views of an enlarged view of portion B on the figures ending with A.

Referring to FIGS. 7A and 7B, preliminary first mold layers 12P and preliminary second mold layers 14P may be alternately and repeatedly stacked on a lower structure 10 in a z direction, perpendicular to the lower structure to form a stacked structure 54. For example, a preliminary lowermost first mold layer 12LP may be formed on an upper surface of the lower structure 10 by thermal oxidation, and then remaining preliminary first mold layers 12P and the preliminary second mold layers 14P may be alternately and repeatedly formed on the preliminary lowermost first mold layer 12LP using a chemical vapor deposition (CVD) process. The preliminary lowermost first mold layer 12LP disposed in a lowermost portion of the stacked structure 54 may be a buffer dielectric film, and the remaining preliminary first mold layers 12P may be interlayer insulation layers. At this time, a thickness of a preliminary uppermost first mold layer 12UP disposed in an uppermost portion of the stacked structure 54 may be relatively thicker than that of the other preliminary first mold layers 12P. The preliminary second mold layers 14P may be replaced with gate layers using a replacement gate process.

The preliminary first mold layers 12P may be formed of an insulating material such as oxide, or the like, and the preliminary second mold layers 14P may be formed of a material having a lower wet etching rate than that of the preliminary first mold layers 12P such as nitride, or the like.

An insulation pattern 18 passing through a portion of the stacked structure 54 may be formed. For example, the insulation pattern 18 may pass through the preliminary uppermost first mold layer 12UP of the preliminary first mold layers 12P and an uppermost preliminary second mold layer of the preliminary second mold layers 14P, and may be formed in a linear shape in a vertical direction (i.e., a z-direction). The insulation pattern 18 may be formed of silicon oxide.

Figure 8A:
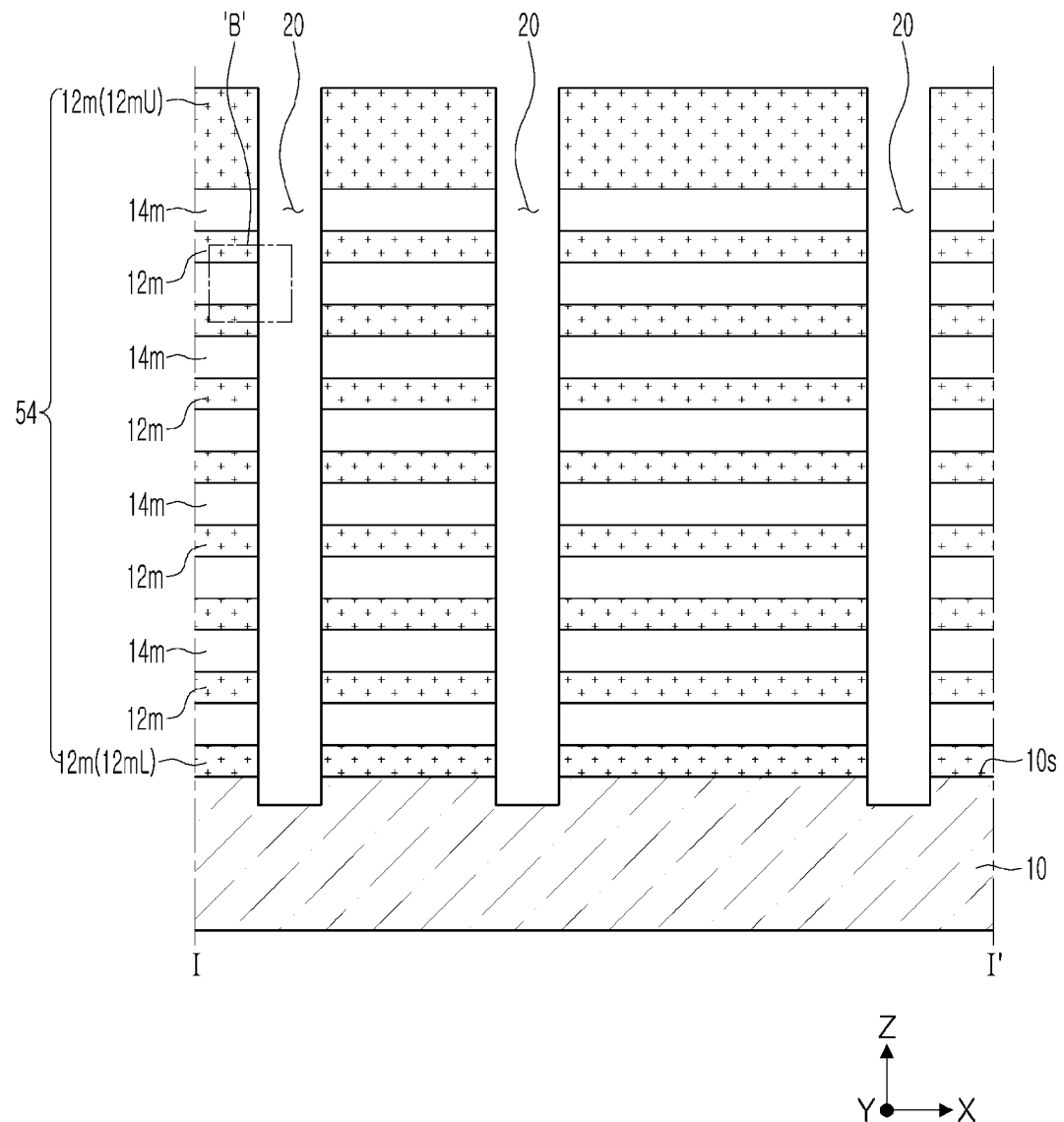
Figure 8B:
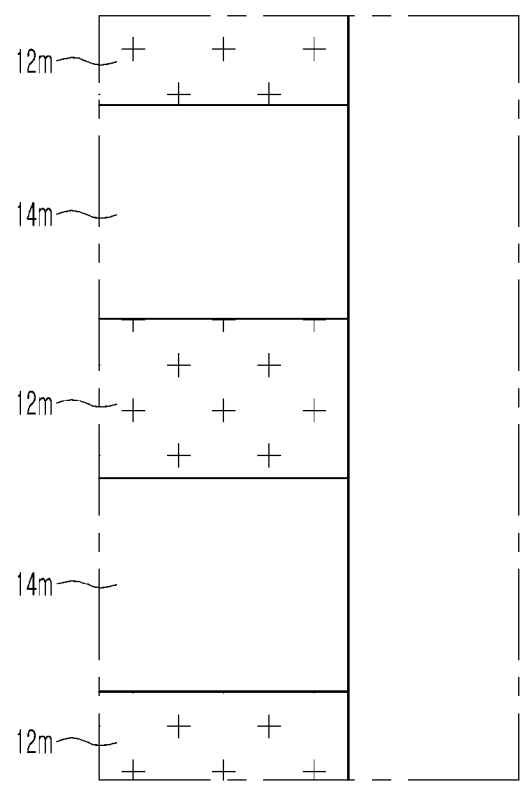

Referring to FIGS. 8A and 8B, a hole 20 may be formed through the preliminary first mold layers 12P and the preliminary second mold layers 14 in a z direction, perpendicular to the lower structure 10 to form first mold layers 12m and second mold layers 14m. For example, the hole 20 may be formed by forming a mask pattern on the preliminary uppermost first mold layer 12UP disposed in an uppermost portion of the stacked structure 54 and removing the preliminary first mold layers 12P and the preliminary second mold layers 14P alternately through the etching process using the mask pattern as an etching mask.

In the holes 20, side surfaces of the first mold layers 12m and side surfaces of the second mold layers 14m may be exposed. For example, the side surface of the holes 20 may be defined by the side surfaces of the first mold layers 12m and the side surfaces of the second mold layers 14m.

Figure 9A:
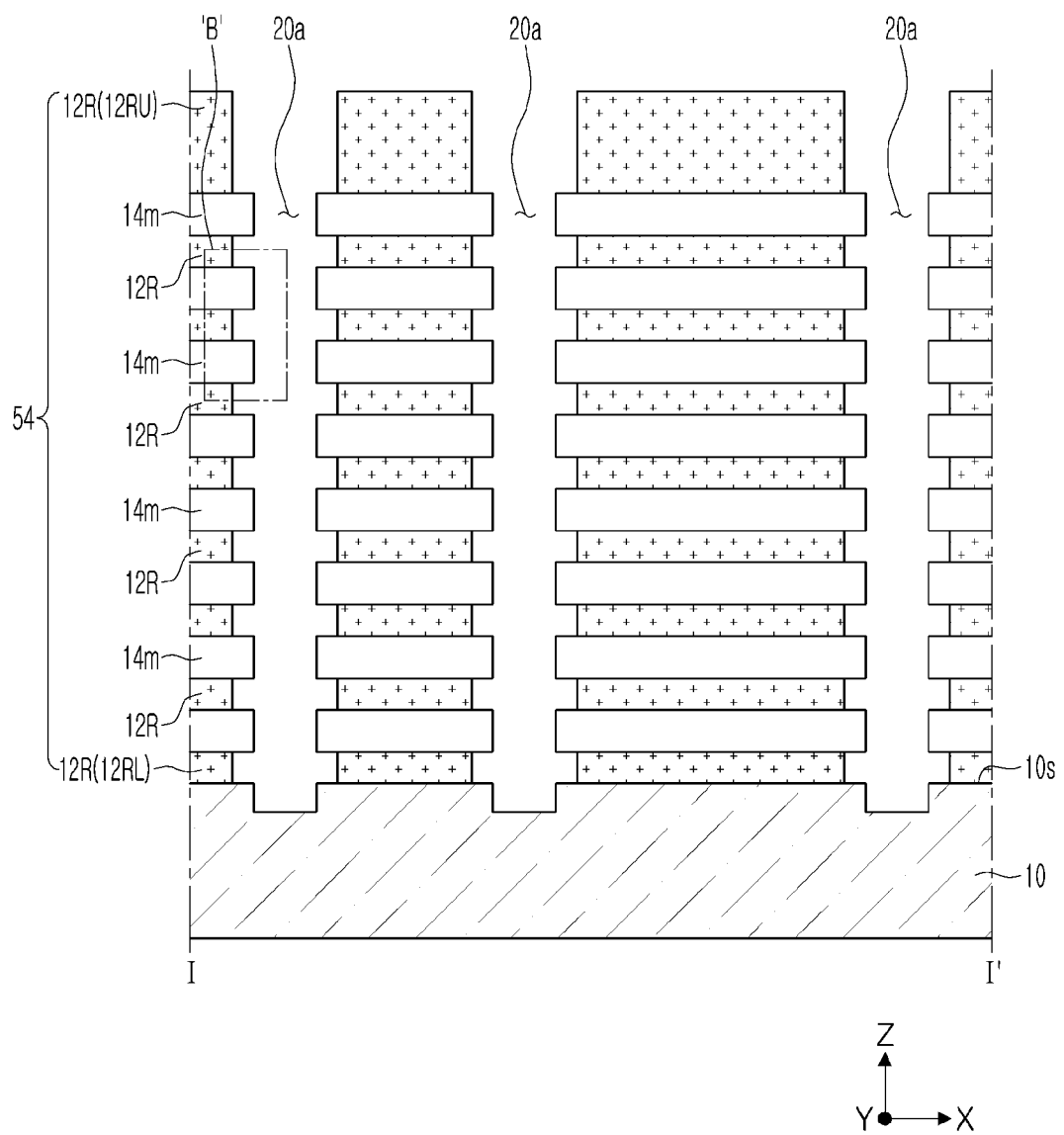
Figure 9B:
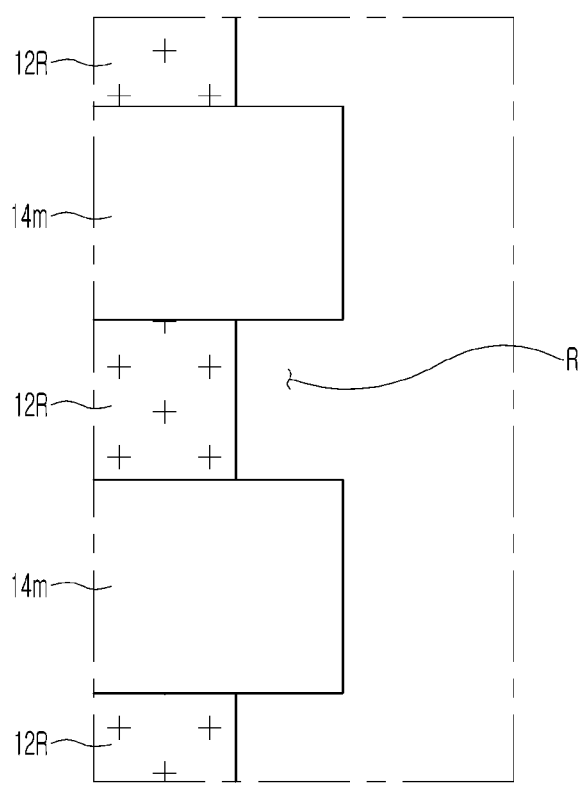

Referring to FIGS. 9A and 9B, the first mold layers 12m may be partially removed to form recess regions R along the side surfaces of the holes 20 formed in the stacked structure 54. The first mold layers 12m may be partially etched using an etching process, for example, a wet etching process using sulfuric acid or hydrofluoric acid as an etchant. The holes 20 may be formed as extended holes 20a. For example, the side surfaces of the first mold layers 12m may be recessed in a direction away from the holes in the wet etching process of which etch etchant may arrive at the side surfaces of the first mold layers 12m through the holes 20. The first mold layers 12m with recessed side surfaces may be referred to as recessed first mold layers 12R.

In an embodiment, a width of each of the recess regions R, i.e., a step difference, between the recessed first mold layers 12R and the second mold layers 14m may be 15 nm or less. For example, the width of each of the recess regions R may corresponds to a half of the difference between a width of one of the second mold layers 14m and its adjacent one of the recessed first mold layers 12R. It is noted that this may be merely an example, and the present embodiment is not limited thereto. For example, a width of the recess regions R may vary depending on the charge diffusion preventing effect, the coverage of step difference in the subsequent process, or the like.

Figure 10A:
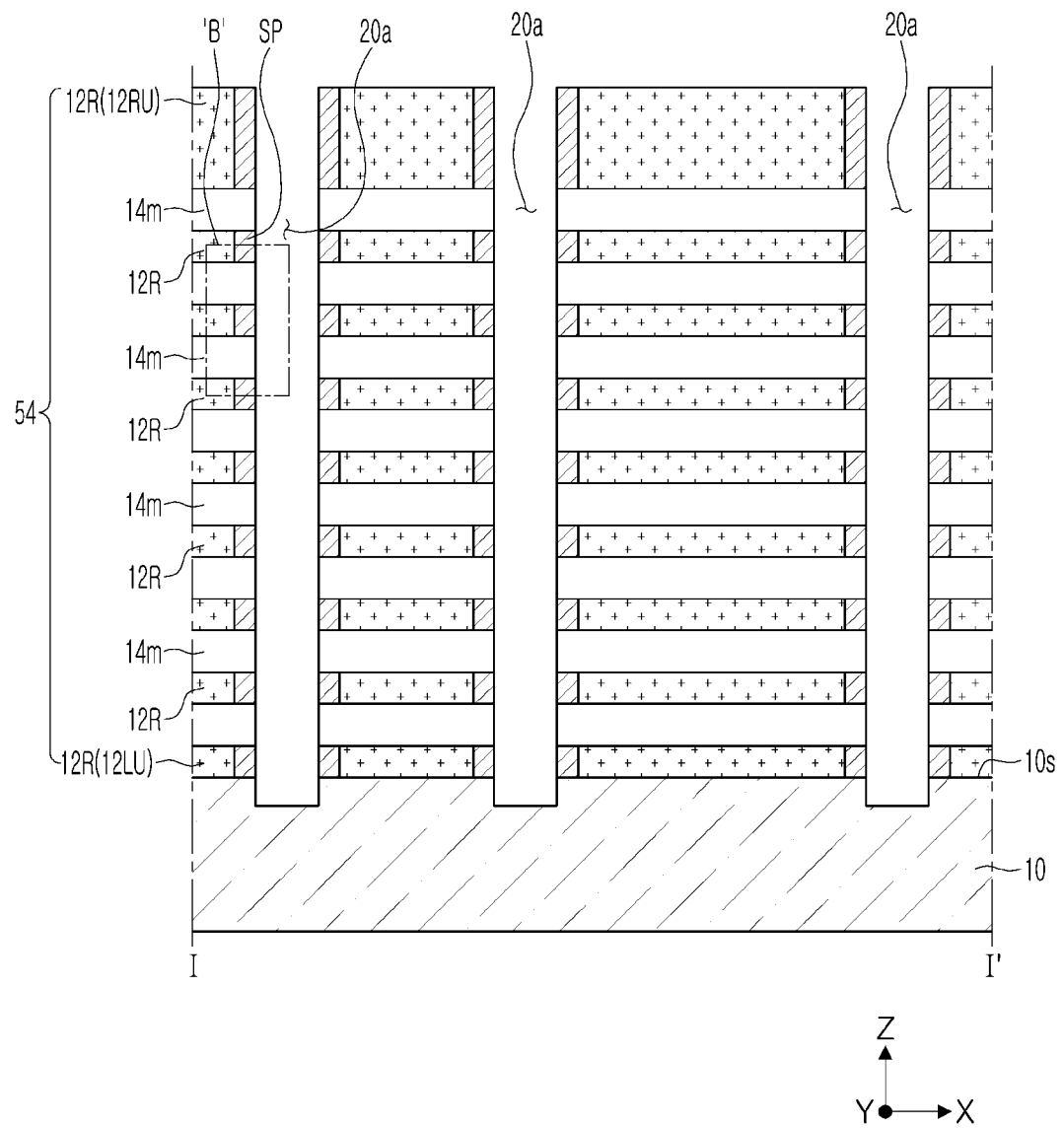
Figure 10B:
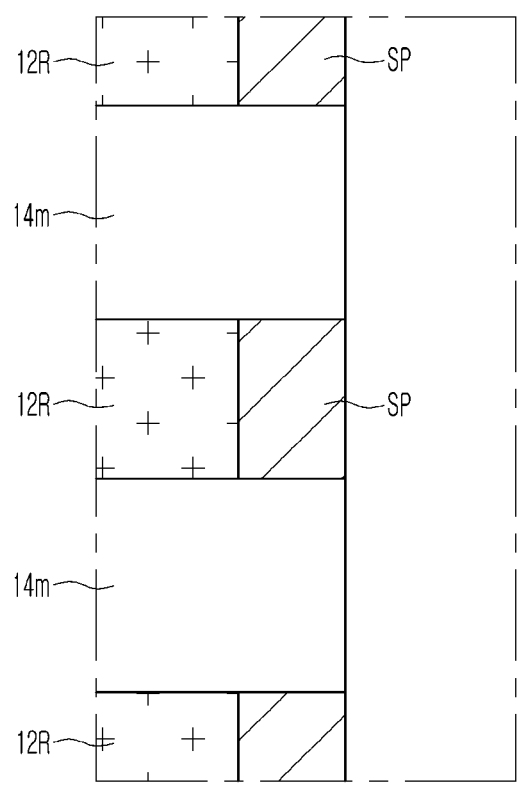

Referring to FIGS. 10A and 10B, the recess regions R may be filled with sacrificial patterns SP formed along the side surfaces of the recessed first mold layers 12R and the side surface of the second mold layers 14m.

In an embodiment, the sacrificial patterns SP may be formed by filling a sacrificial layer in the recess regions R along the inner wall of the extended holes 20a formed in the stacked structure 54, and then etching partially the sacrificial layer to expose the side surfaces of the second mold layers 14m. The sacrificial layer may be formed to have a uniform thickness using an atomic layer deposition (ALD) process or a chemical vapor deposition (CVD) process. For example, the sacrificial layer may be formed on the inner side surfaces of the extended holes 20a, covering the side surfaces of the recessed first mold layers 12R and the side surfaces of the second mold layers 14m. The sacrificial layer may include a semiconductor material such as an N-type conductive polysilicon, undoped polysilicon, or the like. A thickness of the sacrificial layer may be greater than or equal to a thickness of each of the recess regions R. Alternatively, the sacrificial layer may have a thickness such that the sacrificial layer may completely fill the recesses without completely filling the extended holes 20a.

Figure 11A:
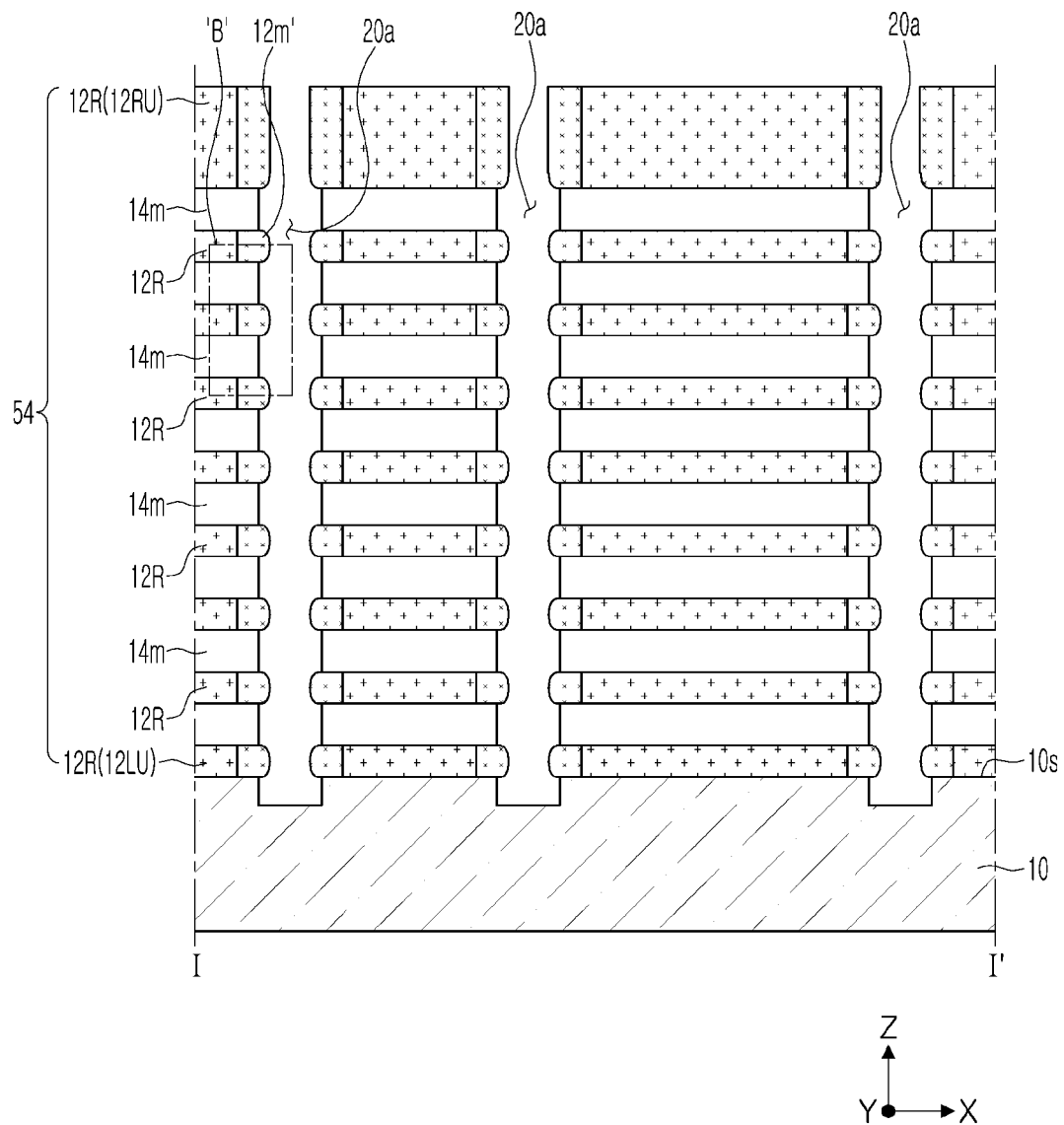
Figure 11B:
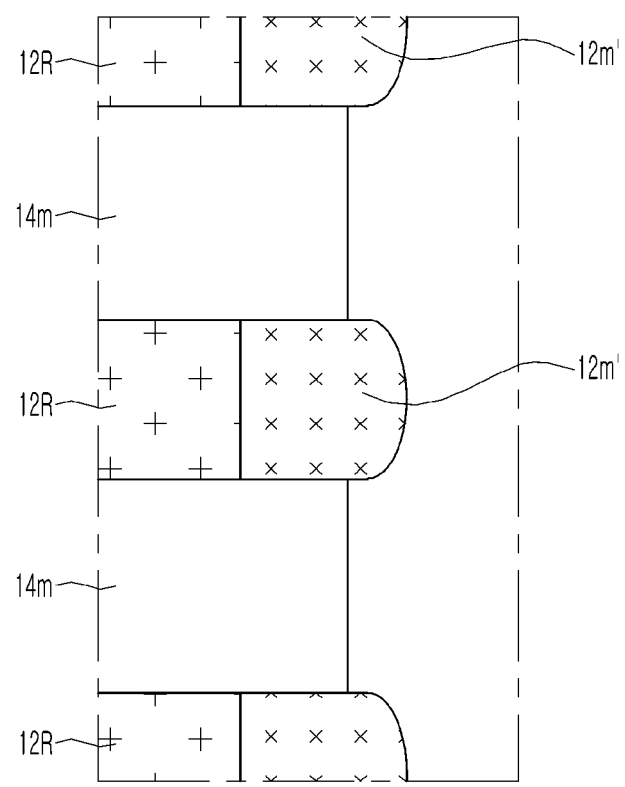

Referring to FIGS. 11A and 11B, third mold layers 12m' extending toward inside of the extended holes 20a may constitute interlayer insulation layers 12 together with the recessed first mold layers 12R. Side surfaces of the third mold layers 12m' and side surfaces of the second mold layers 14m' may be connected to each other to define a corrugated side surface of the extended holes 20a that extends in the vertical direction.

In an embodiment, the third mold layers 12m' extending into the extended holes 20a may be formed by oxidizing the sacrificial patterns SP formed in the recess regions R, and the third mold layers 12m' may contact the recessed first mold layers 12R to form the interlayer insulation layers 12 together with the recessed first mold layers 12R. In an exemplary embodiment, the sacrificial patterns SP may be fully oxidized so that the sacrificial patterns SP may be replaced with the third mold layers 12m'. The present inventive concept is not limited thereto. For example, the sacrificial patterns SP may be partially oxidized so that an unoxidized sacrificial patterns may remain between the third mold layers 12m' and the recessed first mold layers 12R.

In another embodiment, the third mold layers 12m' may be formed by oxidizing the sacrificial layer in the recess regions R. The third mold layers 12m' formed along the inner wall of the extended holes 20a may contact the recessed first mold layers 12R to form interlayer insulation layers 12 together with the recessed first mold layers 12R.

In each embodiment, surfaces of the third mold layers 12m' exposed by the extended holes 20a may have a rounded shape. For example, each of the third mold layers 12m' may have a rounded corner. Since the exposed surfaces of the third mold layers 12m' have a rounded shape, the concentration of the electric field, which may occur at an angled corner if present in each of the third mold layers 12m', may be avoided so that the loss due to lateral charge spreading in a side surface of information storage pattern 28 adjacent to the exposed surface of the third mold layers 12m' may be reduced.

The third mold layers 12m' may fill the recess regions R, and may extend into the extended holes 20a. In each of the third mold layers 12m', a thickness of a portion extending into the extended holes 20a may be thinner than that of remaining portions enclosed by the recess regions R. The present invention is not limited thereto. For example, as shown in FIG. 5B, a thickness of a portion of each of third mold layers extending into the extended holes 20a may have a maximum thickness in the extended holes 20a.

Figure 12A:
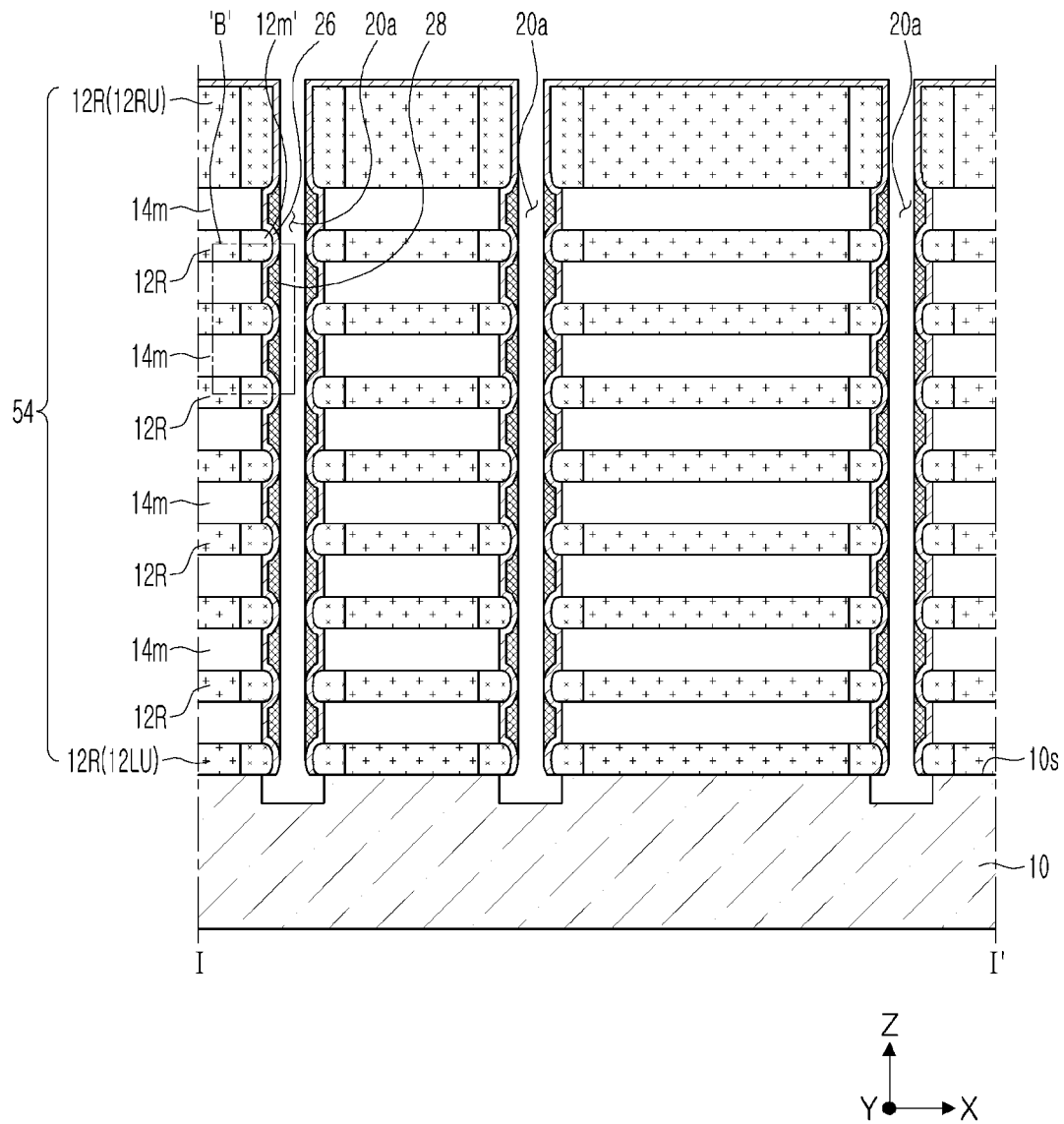
Figure 12B:
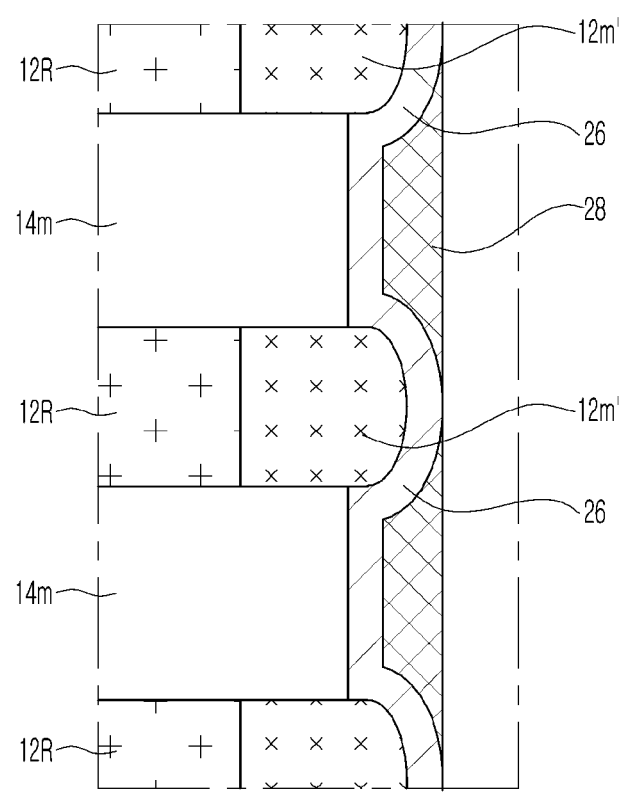

Referring to FIGS. 12A and 12B, a first dielectric layer 26 covering the second mold layers 14m and the third mold layers 12m' may be formed in the extended hole 20a. For example, the first dielectric layer 26 may be conformally formed along the side surfaces of the second mold layers 14m and the interlayer insulation layers 12 composed of the recessed first mold layers 12R and the third mold layers 12m'. Information storage patterns 28 may be formed on the first dielectric layer 26 to be spaced apart from each other in the z direction and to face the second mold layers 14m.

Figure 13A:
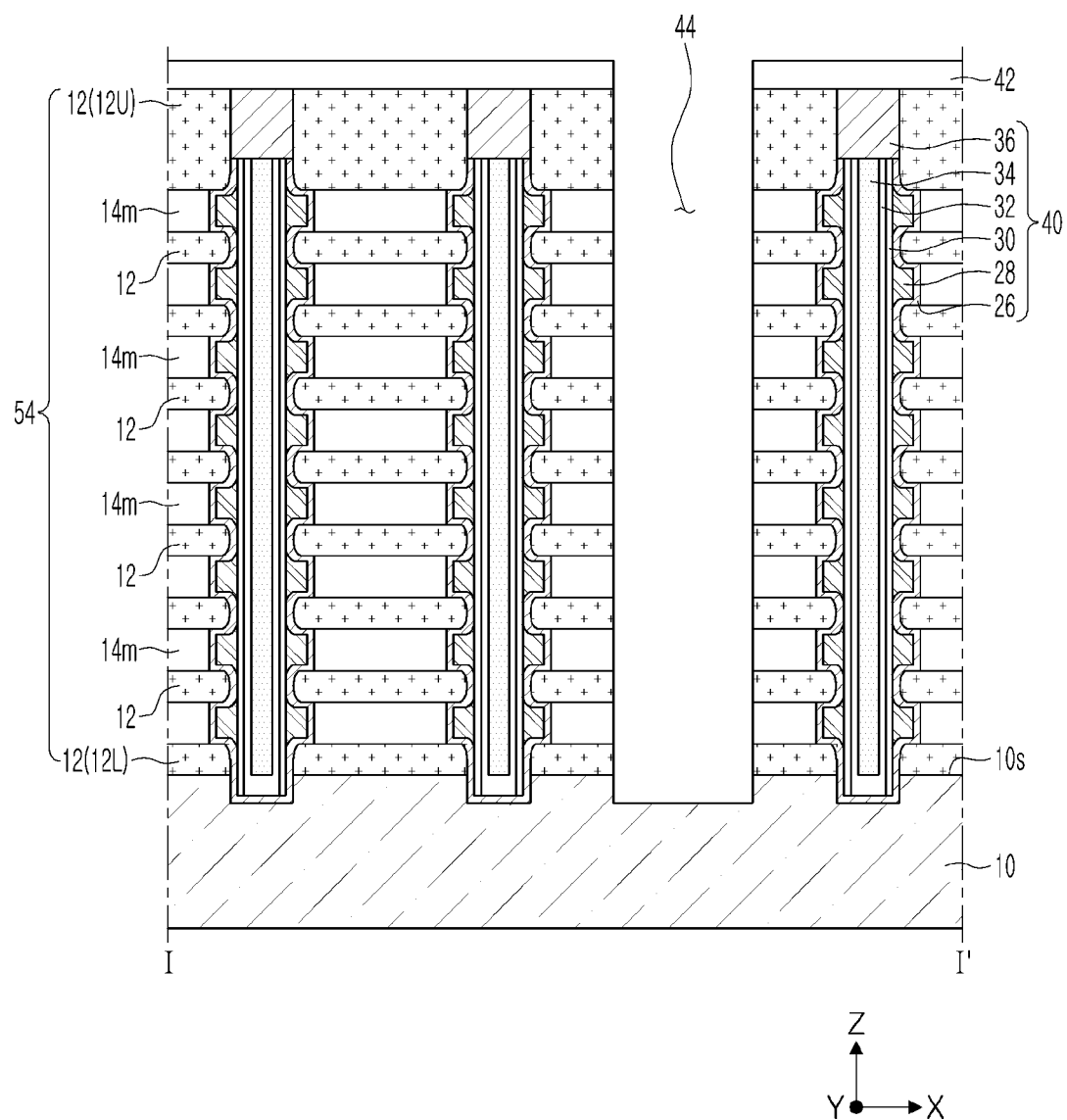
Figure 13B:
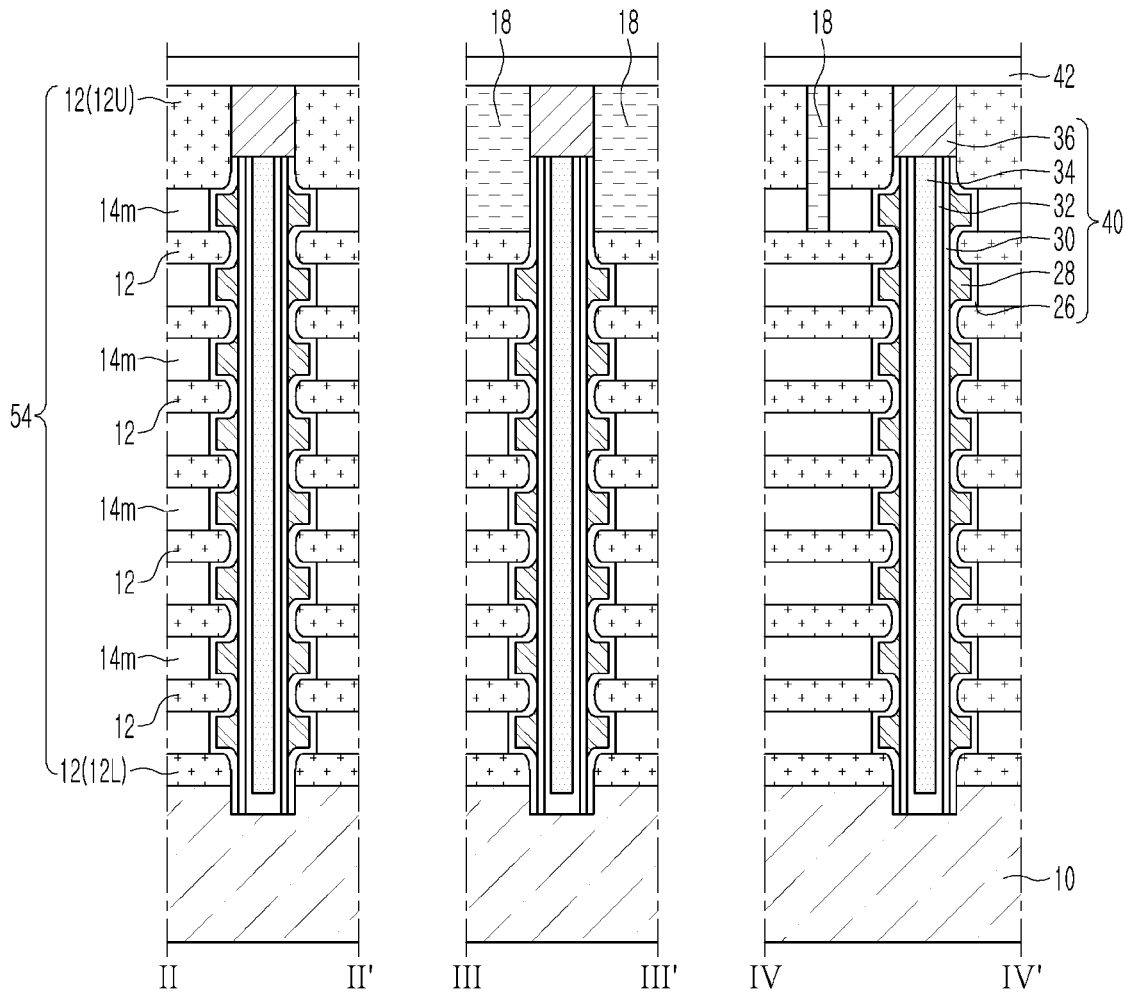

Referring to FIGS. 13A and 13B, a second dielectric layer 30 conformally covering the first dielectric layer 26 and the information storage patterns 28 may be formed, a channel semiconductor layer 32 exposing the lower structure 10 and covering the second dielectric layer 30 may be formed by anisotropically etching the first and second dielectric layers 26 and 30, a core pattern 34 partially filling each of the extended holes (20a in FIGS. 11A and 11B) may be formed on the channel semiconductor layer 32, and a pad pattern 36 filling each of the extended holes (20a in FIGS. 11A and 11B) may be formed. Therefore, vertical memory structures 40 including the first dielectric layer 26, the information storage patterns 28, the second dielectric layer 30, the channel semiconductor layer 32, the core pattern 34, and the pad pattern 36 may be formed in each of the extended holes (20a in FIGS. 11A and 11B).

Next, a first upper insulation layer 42 covering the stacked structure 54 and the vertical memory structures 40 may be formed. Subsequently, a separation trench 44 may be formed through the stacked structure 54 and the first upper insulation layer 42. The separation trench 44 may be formed in a line shape. The separation trenches 44 may expose the lower structure 10, and may expose the second mold layers 14m of the stacked structure 54.

Figure 14A:
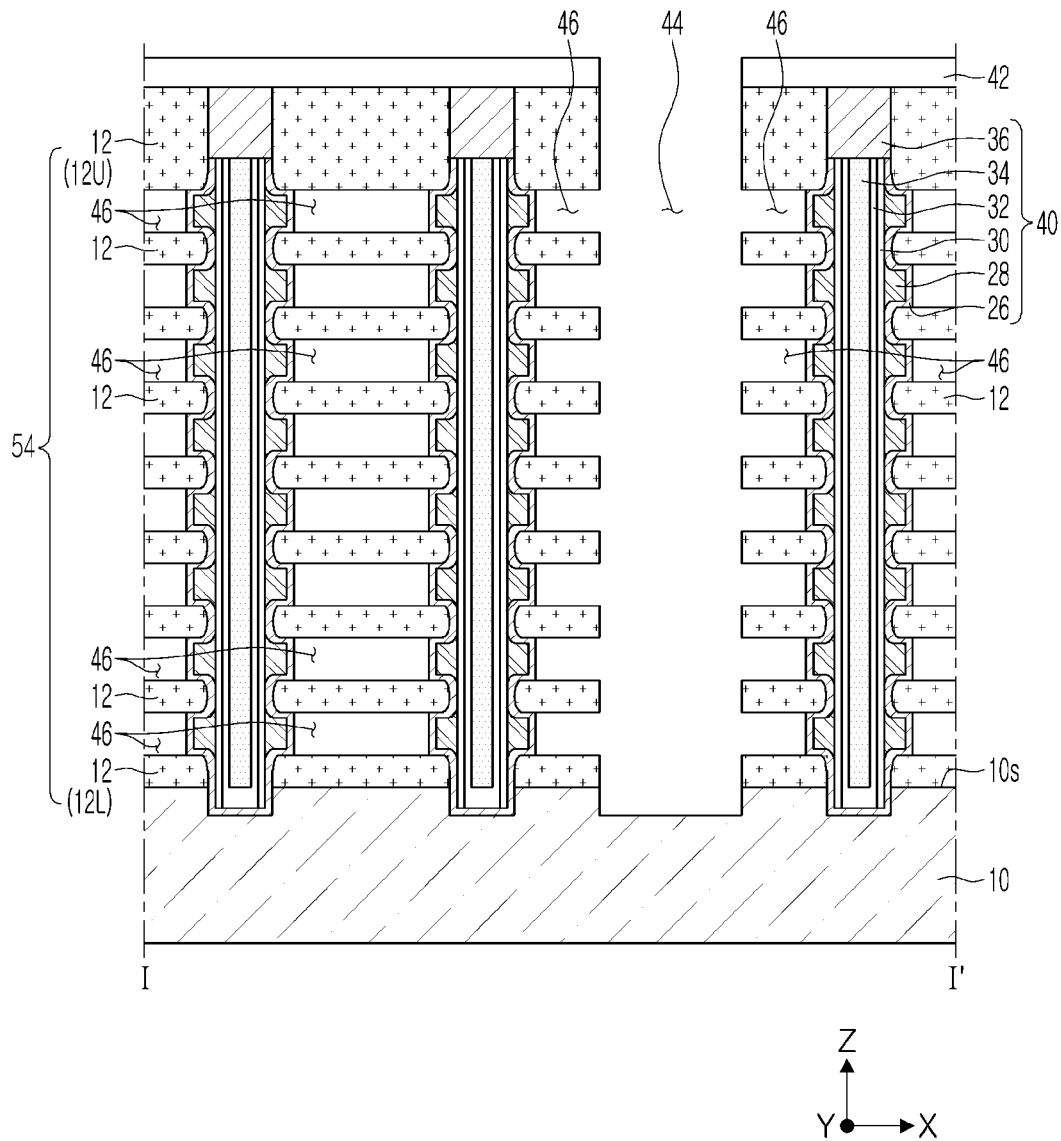
Figure 14B:
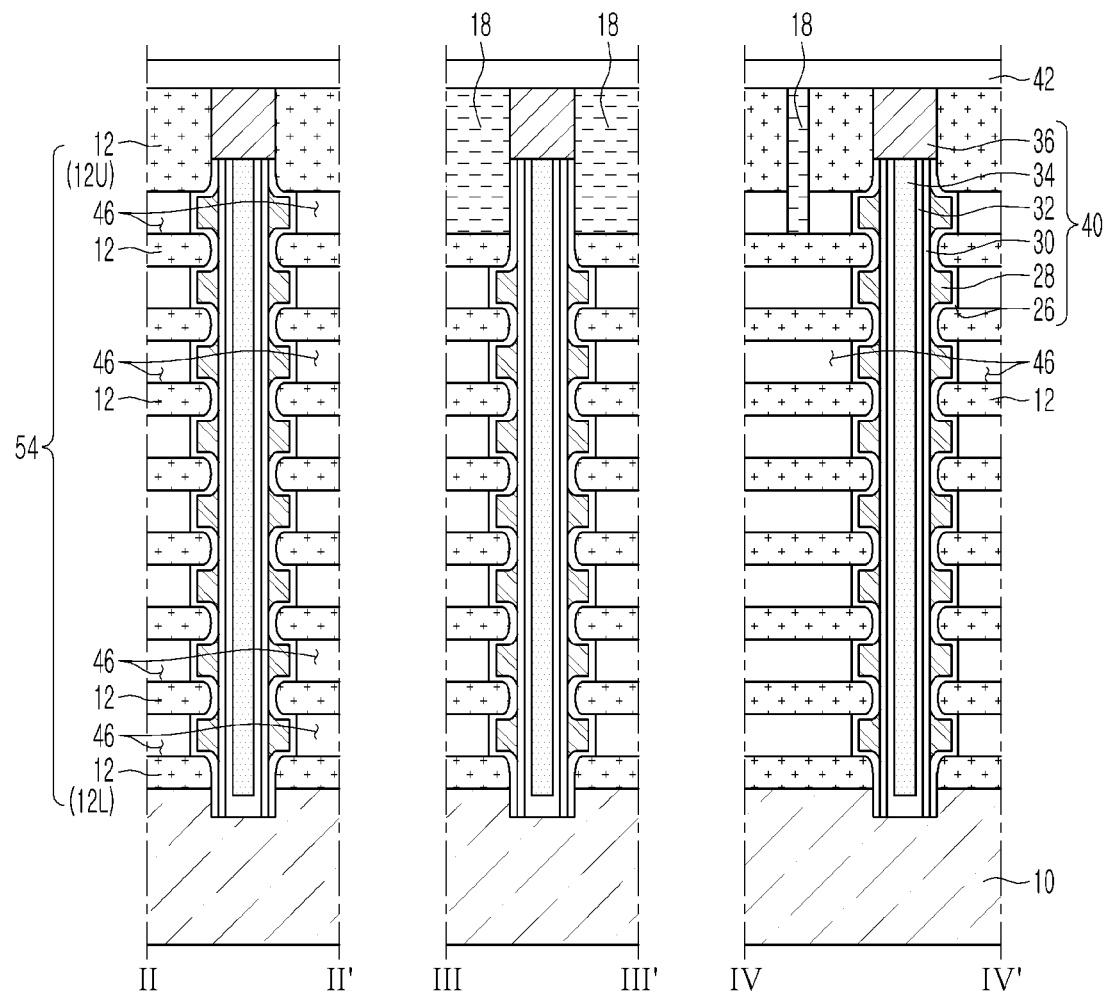

Referring to FIGS. 14A and 14B, a second etching process may be performed at a higher etching speed than that of the first etching process to remove the second mold layers 14m, to form void spaces 46 between the interlayer insulation layers 12. For example, the first etching process for partially etching the first mold layers 12m to form the recess regions (R in FIG. 9B) may be an etching process using an etchant containing sulfuric acid, and the second etching process for removing the second mold layers 14m may be an etching process using an etchant containing phosphoric acid. The etchant of the etching process may vary depending on a kind of the second mold layers 14m. The void spaces 46 may expose the first dielectric layer 26 of the vertical memory structure 40.

Referring again to FIGS. 3, 4A, and 4B, gate patterns 52 may be formed in the void spaces (46 in FIGS. 14A and 14B). The formation of the gate patterns 52 may include forming a first material layer 48 conformally covering inner walls of the void spaces, and forming a second material layer 50 filling the void spaces on the first material layer 48.

A separation structure 60 may be formed in a separation trench 44. The formation of the separation structure 60 may include forming spacers 56 on sidewalls of the separation trenches 44, and forming a separation pattern 58 to fill the separation trenches 44 between the spacers 56.

A second upper insulation layer 62 may be formed on a first upper insulation layer 42 and the separation structure 60. Contact plugs 64 passing through the first and second upper insulation layers 42 and 62 may be formed. Each of the contact plugs 64 may be electrically connected to a corresponding pad pattern 36 of vertical memory structures 40. Conductive lines 66 may be formed on the second upper insulation layer 62. The conductive lines 66 may be electrically connected to the contact plugs 64.

In the embodiments, the information storage patterns 28 may be formed to be confined and isolated between spaces between two adjacent third mold layers 12m' as shown in FIG. 11A. Each of the information storage patterns 28 may be surrounded and isolated by the first and second dielectric layers 26 and 30. Therefore, retention characteristics of information stored in the information storage patterns 28 may be improved.

According to the method of manufacturing a semiconductor device according to example embodiments, reliability of the semiconductor device may be improved by forming the interlayer insulation layers with rounded corners to increase the degree of isolation of the information storage patterns.

The various and advantageous advantages and effects of the present inventive concept is not limited to the above description, and may be more easily understood in the course of describing a specific embodiment of the present inventive concept.

While example embodiments have been illustrated and described above, it will be apparent to those skilled in the art that modifications and variations could be made without departing from the scope of the present inventive concept as defined by the appended claims.

What is claimed is:

1. A method of manufacturing a semiconductor device comprising:
    forming a stacked structure including a plurality of preliminary first mold layers and a plurality of preliminary second mold layers alternately and repeatedly stacked on a lower structure in a vertical direction, perpendicular to an upper surface of the lower structure;
    forming a hole passing through the stacked structure to form a plurality of first mold layers and a plurality of second mold layers, the hole exposing side surfaces of the plurality of first mold layers and side surfaces of the plurality of second mold layers;
    etching partially the plurality of first mold layers exposed by the holes to form a plurality of recess regions and a plurality of recessed first mold layers;
    forming a plurality of third mold layers in the plurality of recess regions to form a plurality of interlayer insulation layers, each of the plurality of interlayer insulation layers including a corresponding recessed first mold layer of the plurality of recessed first mold layers and a corresponding third mold layer of the plurality of third mold layers that are positioned at the same level in the vertical direction,
    wherein each of the plurality of third mold layers is interposed between two adjacent second mold layers of the plurality of second mold layers and is protruded into the hole beyond side surfaces of the two adjacent second mold layers, and
    wherein the plurality of third mold layers are separated from each other in the vertical direction;
    forming a first dielectric layer in the hole along side surfaces of the plurality of third mold layers and the side surfaces of the plurality of second mold layers;
    forming a plurality of information storage patterns on the first dielectric layer, the plurality of information storage patterns being opposite, in a horizontal direction with respect to the upper surface of the lower structure, to the plurality of second mold layers and spaced apart from each other in the vertical direction;
    forming a second dielectric layer covering the first dielectric layer and the plurality of information storage patterns in the hole so that the plurality of information storage patterns are interposed between the first dielectric layer and the second dielectric layer; and
    forming a channel semiconductor layer covering the second dielectric layer in the hole,
    wherein each of the plurality of information storage patterns has an overlapped portion overlapping the plurality of third mold layers in the vertical direction and a non-overlapped portion not overlapping the plurality of third mold layers in the vertical direction.

2. The method of claim 1,
    wherein the overlapped portion of each of the plurality of information storage patterns is adjacent to a corresponding one of the plurality of second mold layers, and the non-overlapped portion of each of the plurality of information storage patterns is adjacent to the second dielectric layer.

3. The method of claim 1,
    wherein the overlapped portion and the non-overlapped portion have different thickness from each other.

4. The method of claim 3,
    wherein the overlapped portion has a thickness greater than a thickness of the non-overlapped portion in the horizontal direction.

5. The method of claim 1,
wherein the forming of the plurality of third mold layers in the recess regions comprises:
forming a sacrificial layer on an inner wall of the hole;
etching the sacrificial layer to form a plurality of sacrificial patterns remaining in the plurality of recess regions; and
oxidizing the plurality of sacrificial patterns to form the plurality of third mold layers.

6. The method according to claim 1, further comprising:
forming a separation trench passing through the plurality of interlayer insulation layers and the plurality of second mold layers;
removing the plurality of second mold layers exposed by the separation trench to form a plurality of void spaces;
forming a plurality of gate patterns in the plurality of void spaces; and
forming a separation structure in the separation trench.

7. A method of manufacturing a semiconductor device comprising:
forming a stacked structure on a substrate by alternately stacking, in a vertical direction with respect to an upper surface of the substrate, a plurality of interlayer insulation layers and a plurality of mold layers on the substrate,
wherein a hole having a corrugated inner side surface passes through the stacked structure, and
wherein each of the plurality of interlayer insulation layers has a rounded corner as part of the corrugated inner side surface of the hole, and
wherein the plurality of interlayer insulating layers are separated from each other in the vertical direction; and
forming a vertical memory structure including a plurality of information storage patterns on the corrugated inner side surface of the hole so that the plurality of information storage patterns are spaced apart from each other in the vertical direction,
wherein the plurality of information storage patterns are opposite, in a horizontal direction with respect to the upper surface of the substrate, to the plurality of mold layers, and
wherein each of the plurality of interlayer insulation layers includes an inner mold layer having a first density and an outer mold layer having a second density greater than the first density.

8. The method of claim 7,
wherein the stacking of the plurality of interlayer insulation layers and the plurality of mold layers comprises:
alternately stacking a plurality of first mold layers and the plurality of mold layers on the substrate;
partially removing the plurality of first mold layers along a side surface of a first hole passing through the stacked structure to form a plurality of recess regions and a plurality of recessed first mold layers;
forming a plurality of sacrificial patterns in the plurality of recess regions; and
oxidizing the plurality of sacrificial patterns to form a plurality of third mold layers that fill the plurality of recess regions, the plurality of third mold layers extending into the first hole,
wherein each of the plurality of interlayer insulation layers includes a corresponding third mold layer of the plurality of third mold layers and a corresponding recessed first mold layer of the plurality of recessed first mold layers that are positioned at the same level in the vertical direction, and
wherein side surfaces of the plurality of third mold layers and side surfaces of the plurality of mold layers are connected to each other to form the corrugated inner side surface of the hole.

9. The method according to claim 8,
wherein the plurality of mold layers are formed of silicon oxide formed by a deposition process;
the plurality of sacrificial patterns are formed of silicon; and
the plurality of third mold layers are formed of silicon oxide formed by the oxidizing of the plurality of sacrificial patterns.

10. The method according to claim 7, further comprising:
forming a separation trench passing through the plurality of interlayer insulation layers and the plurality of mold layers;
removing the plurality of mold layers exposed by the separation trench to form a plurality of void spaces;
forming a plurality of gate patterns in the plurality of void spaces; and
forming a separation structure in the separation trench,
wherein the plurality of void spaces expose the vertical memory structure,
the vertical memory structure further includes a first dielectric layer and a second dielectric layer, and
the first dielectric layer is formed on the corrugated inner side surface of the hole, and
the plurality of information storage patterns are disposed between the first dielectric layer and the second dielectric layer.

* * * * *